United States Patent
Kang et al.

(10) Patent No.: US 12,550,562 B2
(45) Date of Patent: Feb. 10, 2026

(54) DISPLAY PANEL AND DISPLAY APPARATUS

(71) Applicant: LG Display Co., Ltd., Seoul (KR)

(72) Inventors: In Kang, Paju-si (KR); Daesung Jung, Paju-si (KR); Daekyu Kim, Paju-si (KR); Jeongho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 18/429,040

(22) Filed: Jan. 31, 2024

(65) Prior Publication Data

US 2025/0294978 A1    Sep. 18, 2025

(30) Foreign Application Priority Data

Jan. 31, 2023  (KR) .................. 10-2023-0012491

(51) Int. Cl.
*H10K 59/131*  (2023.01)
*G09G 3/3233*  (2016.01)
(Continued)

(52) U.S. Cl.
CPC ......... *H10K 59/131* (2023.02); *G09G 3/3233* (2013.01); *H10K 59/879* (2023.02); *G09G 3/3275* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0243* (2013.01); *G09G 2310/0289* (2013.01);
(Continued)

(58) Field of Classification Search
CPC ............. H10K 59/00–95; H10K 59/35; H10K 59/353; H10K 50/858; H10K 59/879; G09G 2320/028; G09G 2320/068
See application file for complete search history.

(56) References Cited

U.S. PATENT DOCUMENTS

| | | | |
|---|---|---|---|
| 11,730,031 B2 | 8/2023 | Lee et al. | |
| 2011/0284881 A1* | 11/2011 | Shikina | H10K 59/879 |
| | | | 257/E27.121 |

(Continued)

FOREIGN PATENT DOCUMENTS

| | | |
|---|---|---|
| CN | 111831173 A | 10/2020 |
| EP | 4354421 A1 | 4/2024 |

(Continued)

*Primary Examiner* — Sanjiv D. Patel
(74) *Attorney, Agent, or Firm* — Seed Intellectual Property Law Group LLP

(57) ABSTRACT

A display panel and a display apparatus are disclosed. The display panel may adjust a ratio of a plurality of regions enabling a viewing angle to be independently controlled. The display panel may be mounted to or incorporated into a body having a motor such as an automobile. The display panel may include a plurality of pixel blocks each including a plurality of unit pixels disposed in a display area, and a plurality of mode control line sets respectively connected with the plurality of pixel blocks. Each of the plurality of mode control line sets may include a first mode control line transferring a first mode control signal and a second mode control line transferring a second mode control signal. Each subpixel include first and second light emitting devices connected with a driving transistor, first and second lens region on the first and second light emitting devices, respectively.

25 Claims, 15 Drawing Sheets

(51) Int. Cl.
  *H10K 59/80* (2023.01)
  *G09G 3/3275* (2016.01)
(52) U.S. Cl.
  CPC ... *G09G 2320/068* (2013.01); *G09G 2358/00* (2013.01); *G09G 2380/10* (2013.01)

(56) References Cited

U.S. PATENT DOCUMENTS

| | | | |
|---|---|---|---|
| 2012/0104368 A1* | 5/2012 | Isobe | H10K 59/35 257/40 |
| 2021/0201783 A1 | 7/2021 | Oh | |
| 2022/0343843 A1 | 10/2022 | Du et al. | |
| 2022/0367597 A1* | 11/2022 | Nishiyama | H10K 59/1216 |
| 2022/0392397 A1 | 12/2022 | Seo et al. | |
| 2022/0399529 A1* | 12/2022 | Shin | G09G 3/3275 |

FOREIGN PATENT DOCUMENTS

| | | |
|---|---|---|
| JP | H10319872 A | 12/1998 |
| JP | 2012058639 A | 3/2012 |
| JP | 2012123349 A | 6/2012 |
| JP | 2020510225 A | 4/2020 |
| JP | 2022100254 A | 7/2022 |
| KR | 20150062356 A | 6/2015 |
| KR | 20210148539 A | 12/2021 |

\* cited by examiner

DISPLAY PANEL AND DISPLAY APPARATUS

CROSS-REFERENCE TO RELATED APPLICATIONS

This application claims the benefit of the Korean Patent Application No. 10-2023-0012491 filed on Jan. 31, 2023, which is hereby incorporated by reference as if fully set forth herein.

BACKGROUND

Technical Field

The present disclosure relates to a display panel and a display apparatus, which may control a viewing angle.

Description of the Related Art

Electronic devices of various fields include a display apparatus which displays an image. For example, a plurality of display apparatuses for providing desired information or content to a driver or an occupant may be applied to vehicles.

Research for enlarging a screen of a display apparatus disposed at a center of a dashboard among display apparatuses equipped in vehicles is being done.

In such display apparatuses, it is required to control a viewing angle on the basis of the requirements of users or content, for a driver and an occupant. Also, considering the usability of display apparatuses, a method for freely adjusting a ratio of a region enabling the control of a viewing angle is needed.

The above-described background is part of the present disclosure to devise the present disclosure or is technical information acquired by a process of devising the present disclosure, but may not be regarded as the known art disclosed to the general public before the present disclosure is disclosed.

BRIEF SUMMARY

Accordingly, various embodiments of the present disclosure is directed to providing a display panel and a display apparatus that substantially obviate one or more problems due to limitations and disadvantages of the related art.

Various embodiments of the present disclosure provides a display panel and a display apparatus, which may adjust a ratio of a plurality of regions, enabling a viewing angle to be independently controlled, of a display area and may decrease a density of a pixel pattern.

Additional advantages and features of the disclosure will be set forth in part in the description which follows and in part will become apparent to those having ordinary skill in the art upon examination of the following or may be learned from practice of the disclosure. The technical benefits and other advantages of the disclosure may be realized and attained by the structure particularly pointed out in the written description and claims hereof as well as the appended drawings.

To achieve these and other benefits and in accordance with the purpose of the disclosure, as embodied and broadly described herein, there is provided a display panel including a plurality of pixel blocks each including a plurality of unit pixels disposed in a display area, a bezel area disposed outside the display area, and a plurality of mode control line sets respectively connected with the plurality of pixel blocks. Each of the plurality of mode control line sets may include a first mode control line transferring a first mode control signal and a second mode control line transferring a second mode control signal. Each of the plurality of unit pixels may include a plurality of subpixels. Each of the plurality of subpixels includes a first light emitting device connected with a driving transistor through a first mode control transistor controlled by the first mode control signal, a first lens region disposed on the first light emitting device, a second light emitting device connected with the driving transistor through a second mode control transistor controlled by the second mode control signal, and a second lens region disposed on the second light emitting device, and one of the first mode control line, the second mode control line, and a second power line is disposed in parallel with a first power line, for at least some portions between the unit pixels. That is, one of the signal lines among the first mode control line, the second mode control line, and a second power line may be disposed in parallel with a first power line at certain areas or at certain locations within the display panel. In particular, one of the signal lines among the first mode control line, the second mode control line, and a second power line may be parallel with a first power line in between unit pixels. However, in other locations, the signal lines mentioned above does not necessarily have to be parallel with the first power line at other locations in the display panel.

In another aspect of the present disclosure, there is provided a display apparatus including the display panel and a data driver disposed in the bezel area to drive data lines disposed in the display area, wherein the data driver may individually supply the first mode control signal and the second mode control signal to each of the plurality of mode control line sets.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
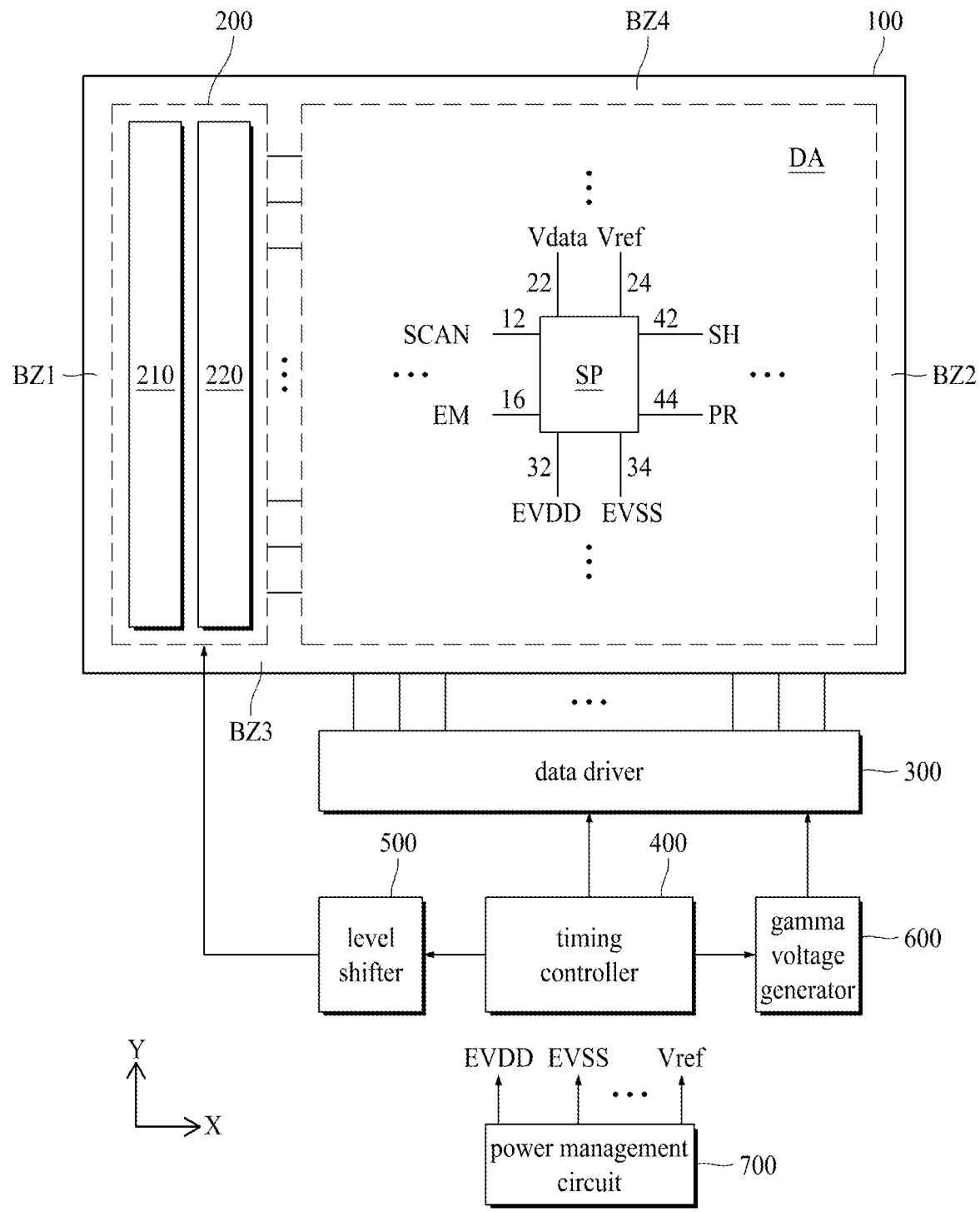
FIG. 1 is a diagram schematically illustrating a configuration of a display apparatus according to an embodiment.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a dimension (e.g., length, width, height, thickness, radius, diameter, area, etc.), a ratio, an angle, and a number disclosed in the drawings for describing aspects of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct (ly)" is used.

In describing a time relationship, for example, when the temporal order is described as, for example, "after," "subsequent," "next," and "before," a case which is not continuous may be included unless a more limiting term, such as "just," "immediate (ly)," or "direct (ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. As for the expression that an element or a layer is "connected," "coupled," or "adhered" to another element or layer, the element or layer may not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in co-dependent relationship.

Hereinafter, the aspect of the present disclosure will be described with reference to the accompanying drawings. Since a scale of each of elements shown in the accompanying drawings is different from an actual scale for convenience of description, the present disclosure is not limited to the shown scale. Further, all the components of each display apparatus according to all aspects of the present disclosure are operatively coupled and configured.

FIG. 1 is a diagram schematically illustrating a configuration of a display apparatus according to an embodiment.

The display apparatus according to an embodiment may be an electroluminescent display apparatus including an organic light emitting diode (OLED) display apparatus, a quantum-dot light emitting diode display apparatus, or an inorganic light emitting diode display apparatus.

Referring to FIG. 1, the display apparatus according to an embodiment may include a display panel 100, a gate driver 200 which is embedded in the display panel 100, a data driver 300 which is connected with the display panel 100, a timing controller 400 which controls the gate driver 200 and the data driver 300, a gamma voltage generator 600, and a power management circuit 700. In an embodiment, the display apparatus may further include a level shifter 500 which is connected between the timing controller 400 and the gate driver 200. In an embodiment, the data driver 300, the timing controller 400, the gamma voltage generator 600, and the level shifter 500 may be integrated as a display driver.

The display panel 100 may be a rigid display panel, or may be a flexible display panel capable of shape modification like foldable, bendable, rollable, and stretchable display panels.

The display panel 100 may include a display area DA which displays an image and bezel areas BZ1 to BZ4 which are disposed at outer portion of the display area DA to surround the display area DA.

The display panel 100 may display an image by using the display area DA where a plurality of subpixels SP are arranged in a matrix type. A pixel matrix disposed in the display area DA may include a plurality of row lines and a plurality of column lines, which are configured with a plurality of subpixels SP.

Each subpixel SP may be one of a red subpixel which emits red light, a green subpixel which emits green light, a blue subpixel which emits blue light, and a white subpixel which emits white light. A unit pixel may include at least two subpixels SP.

A plurality of signal lines, including a data line 12, gate lines 12 and 16, power lines 24, 32, and 34, and mode control lines 42 and 44 connected with each subpixel SP, may be disposed in the display panel 100.

The data line 12 may transfer a data voltage Vdata, supplied from the data driver 300, to each subpixel SP.

One of the gate lines 12 and 16 may transfer a scan signal SCAN, supplied from the gate driver 200, to each subpixel SP, and the other gate line 16 may transfer an emission control signal EM, supplied from the gate driver 12, to each subpixel SP.

An initialization voltage line 24 of the power lines 24, 32, and 34 may transfer an initialization voltage Vref, supplied from the power management circuit 700, to each subpixel SP, a first power line 32 may transfer a high level source voltage EVDD to each subpixel SP through a common electrode (a cathode electrode), and a second power line 34 may transfer a low level source voltage EVSS to each subpixel SP through the common electrode (the cathode electrode).

A first mode control line 42 of the mode control lines 42 and 44 may transfer a first mode control signal SH, supplied from the data driver 300 or a separate mode controller (not shown), to each subpixel SP, and a second mode control line 44 may transfer a second mode control signal PR, supplied from the data driver 300 or the separate mode controller, to each subpixel SP.

Each subpixel SP may include first and second light emitting devices, a pixel circuit which includes a plurality of transistors independently driving the first and second light emitting devices, a first lens region which is disposed on the first light emitting device, and a second lens region which is disposed on the second light emitting device. The first lens region and the second lens region may differently control a light irradiation angle, namely, a viewing angle.

For example, each subpixel SP may drive the first light emitting device to implement a wide viewing angle mode or a share mode through the first lens region. Each subpixel SP may drive the second light emitting device to implement a narrow viewing angle mode or a privacy mode which narrower restricts a viewing angle than the wide viewing angle, through the second lens region.

The display apparatus or the display panel 100 may selectively drive the first light emitting device and the second light emitting device of each subpixel SP by using mode control signals SH and PR to control a viewing angle of each subpixel SP. The display apparatus or the display panel 100 may selectively drive the first and second light emitting devices in each subpixel SP by using the mode control signals SH and PR, and thus, the display area DA may be divided into a plurality of regions capable of being controlled to different viewing angles and may be divisionally driven and a ratio or an area of the plurality of regions may be freely adjusted to a first direction X and a second direction Y. This will be described below in detail.

For example, as the first light emitting device is driven in each subpixel SP, one of the plurality of regions of the display area DA may operate in the wide viewing angle through the first lens region, and when the second light emitting device is driven, the one region may operate in the narrow viewing angle through the second lens region. As the second light emitting device is driven in each subpixel SP, the other one region of the plurality of regions may operate in the narrow viewing angle through the second lens region, and when the first light emitting device is driven, the other one region may operate in the wide viewing angle through the first lens region. The plurality of regions may be driven in different viewing angle modes, or may be driven in the same viewing angle mode.

The display panel 100 according to an embodiment may further include a touch sensor screen which is disposed in the display area DA to sense a user touch.

The display panel 100 according to an embodiment may be a touch display panel with a touch sensor array imbedded therein. For example, the display panel 100 according to an embodiment may include a pixel array which includes a pixel device layer including a plurality of transistors disposed on a substrate and a light emitting device layer including a plurality of light emitting devices disposed on the circuit device layer, an encapsulation layer which is disposed on the pixel array to seal the light emitting device layer, a touch sensor array which includes a plurality of touch electrodes disposed on the encapsulation layer, and a lens array which includes first and second lenses disposed on the touch sensor array. The display panel 100 according to an embodiment may further include an optical film, an optical clear adhesive (OCA), a cover substrate, and a protection film, which are sequentially arranged on the lens array. The display panel 100 according to an embodiment may further include a black matrix and a color filter disposed between the touch sensor array and the lens array.

The gate driver 200 may be disposed in at least one of the plurality of bezel areas (for example, first and second bezel areas) BZ1 to BZ2 disposed at the outer portion of the display area DA. For example, the gate driver 200 may be disposed in one of the first and second bezel areas BZ1 and BZ2 which face each other with the display area DA therebetween, or may be disposed at both sides of the first and second bezel areas BZ1 and BZ2. The gate driver 200 may be disposed as a gate in panel (GIP) type where the gate driver 200 includes transistors which are formed in the same process as transistors disposed in the display area DA.

The gate driver 200 may include a scan driver 210, which drives at least one gate line 12 of the plurality of gate lines 12 and 16 connected with subpixels SP of each pixel row line, and an emission control driver 220 which drives the other gate line 16.

The number of gate lines 12 and 16, the number of scan drivers 210, and the number of emission control drivers 220, connected with the subpixels SP of each pixel row line, are not limited to the illustration of FIG. 1 and may be variously changed based on a detailed configuration of the pixel circuit configuring each subpixel SP.

Each of the scan driver 210 and the emission control driver 220 may be supplied with a plurality of gate control signals through the level shifter 500 from the timing controller 400 and may operate based on the gate control signals. In an embodiment, each of the scan driver 210 and the emission control driver 220 may be supplied with the plurality of gate control signals through the level shifter 500 from the timing controller 400.

The level shifter 500 may be supplied with control signals from the timing controller 400 and may perform level shifting or logic processing to generate the plurality of gate control signals, and then, may supply the gate control signals to the scan driver 210 and the emission control driver 220.

The scan driver 210 may supply at least one scan signal SCAN to each of the plurality of pixel row lines by using the plurality of gate control signals supplied from the level shifter 500 or the timing controller 400. The scan driver 210 may supply the scan signal SCAN to the at least one gate line 12 of the plurality of gate lines 12 and 16 connected with the subpixels SP of each pixel row line.

The emission control driver 220 may supply a plurality of emission control signals to each of a plurality of pixel lines by using the plurality of gate control signals supplied from the level shifter 500 or the timing controller 400. The emission control driver 220 may supply an emission control signal EM to the at least one gate line 16 of the plurality of gate lines 12 and 16 connected with the subpixels SP of each pixel row line.

At least one of a low temperature polysilicon (LTPS) transistor including an LTPS semiconductor and an oxide transistor including a metal oxide semiconductor may be applied to the plurality of transistors provided in the display area DA of the display panel 100 and the plurality of transistors provided in the bezel areas BZ1 to BZ4 including the gate driver 200. To decrease power consumption, the LTPS transistor and the oxide transistor may be configured in the display panel 100 according to an embodiment together.

The gamma voltage generator 600 may generate a plurality of reference gamma voltages having different levels and may supply the reference gamma voltages to the data driver 300. The gamma voltage generator 600 may generate the plurality of reference gamma voltages corresponding to a gamma characteristic of the display apparatus, based on control by the timing controller 400, and may supply the plurality of reference gamma voltages to the data driver 300. In an embodiment, the gamma voltage generator 600 may adjust reference gamma voltage levels with gamma data supplied from the timing controller 400 and may output a level-adjusted reference gamma voltage to the data driver 300.

The data driver 300 may convert digital data, supplied from the timing controller 400 along with data control signals, into an analog data signal and may supply each data voltage Vdata to each data line 22 of the display panel 100. The data driver 300 may subdivide the plurality of reference gamma voltages supplied from the gamma voltage generator 600 and may convert digital data into an analog data voltage by using subdivided gamma voltages.

The data driver 300 may include at least one data drive integrated circuit (IC) which drives a plurality of data lines DL provided in the display panel 100. Each of the data drive ICs may be mounted on a corresponding circuit film and may be connected with the display panel 100. A circuit film with a data drive IC mounted thereon may be bonded and connected to the bezel area BZ3, where a pad area of the display panel 100 is disposed, through an anisotropic conductive film (ACF). A chip on film (COF), a flexible printed circuit (FPC), or a flexible flat cable (FFC) may be applied to the circuit films.

In an embodiment, the data driver 300 may generate the mode control signals SH and PR and may respectively supply the mode control signals SH and PR to the mode control lines 42 and 44 of the display panel 100. In an embodiment, the mode control signals SH and PR may be generated by the mode controller separated from the data driver 300 and may be supplied to the display panel 100 through the circuit film with the data drive IC mounted thereon.

The timing controller 400 may control the gate driver 200 and the data driver 300 by using timing control signals supplied from a host system and timing setting information stored therein.

The timing controller 400 according to an embodiment may generate the plurality of gate control signals which control a driving timing of the gate driver 200 and may supply the gate control signals. The timing controller 400 according to an embodiment may generate control signals for timing control so that the level shifter 500 generates the plurality of gate control signals and supplies the gate control signals to the gate driver 200 and may supply the control signals to the level shifter 500.

The timing controller 400 may generate a plurality of data control signals which control a driving timing of the data driver 300 and may supply the data control signals to the data driver 300. The timing controller 400 according to an embodiment may be supplied with input video data and may perform various image processing which includes image quality correction, degradation correction, and luminance correction for a reduction in power consumption, and thus, may supply image-processed data to the data driver 300.

The power management circuit 700 may generate a plurality of driving voltages needed for operations of all circuit configurations of the display apparatus by using an input voltage and may supply the driving voltages. The power management circuit 700 may generate a first source voltage EVDD, a second source voltage EVSS, and an initialization voltage Vref (a reference voltage) and may supply the generated voltages to the display panel 100. The power management circuit 700 may generate and supply various driving voltages needed for operations of the gate driver 200, the data driver 300, the timing controller 400, the gamma voltage generator 600, the level shifter 500, and the power management circuit 700.

Figure 2:
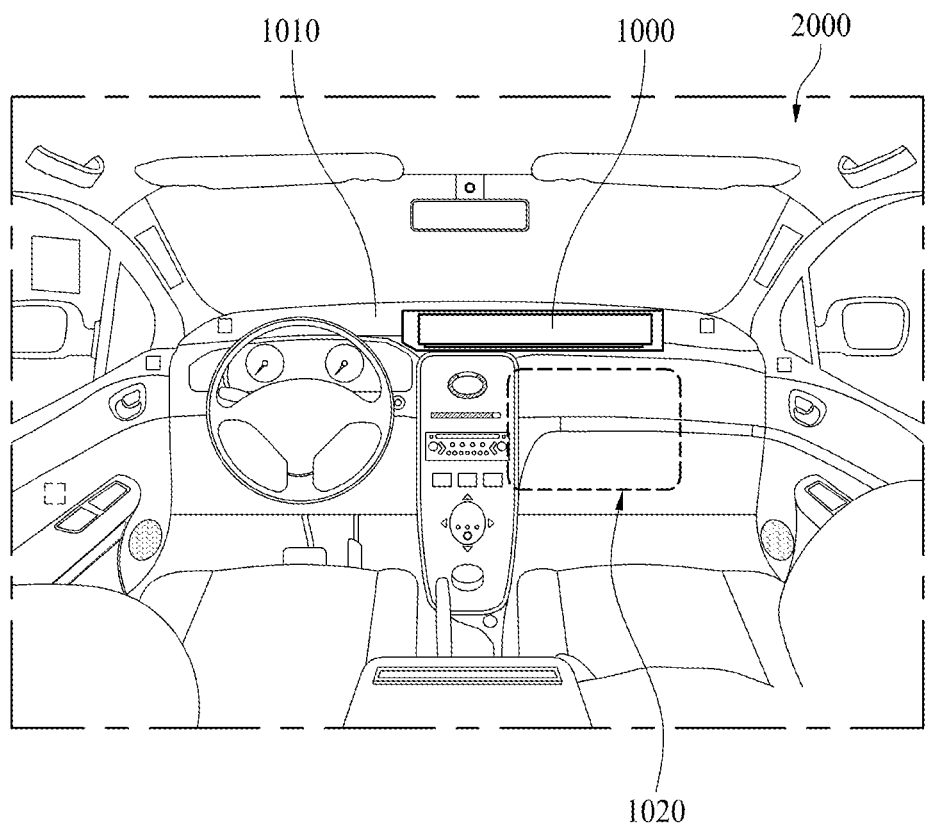
FIG. 2 is a diagram illustrating a structure where a display apparatus according to an embodiment is applied to a vehicle.

FIG. 2 is a diagram illustrating a structure where a display apparatus 1000 according to an embodiment is applied to a vehicle 2000 (e.g., automobile). FIGS. 3A to 3D are diagrams illustrating various examples where a ratio of a first area and a second area is changed in a display panel according to an embodiment. FIGS. 4A and 4B are perspective views illustrating first and second lens structures of a display panel according to an embodiment.

Figure 3A:
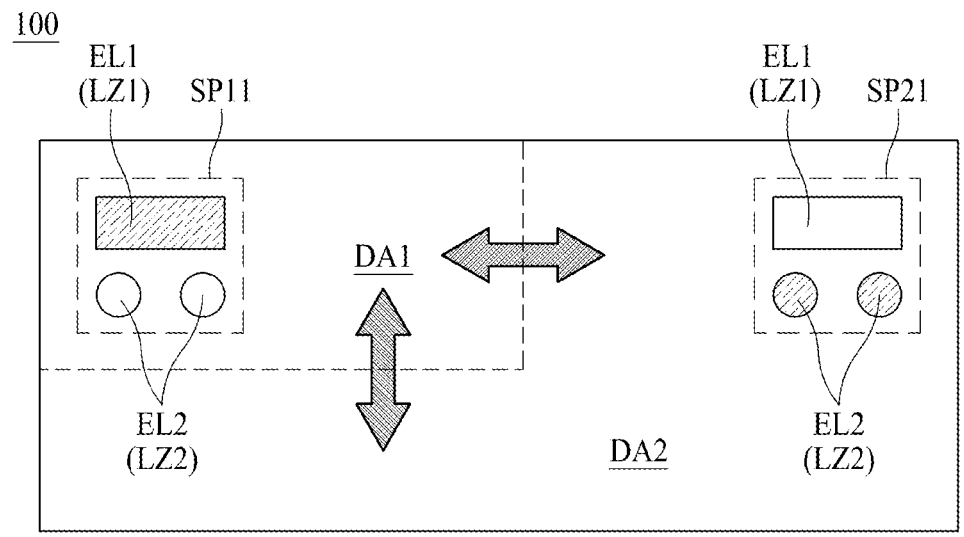
FIGS. 3A to 3D are diagrams illustrating various examples where a ratio of a first area and a second area is changed in a display panel according to an embodiment.
Figure 3B:
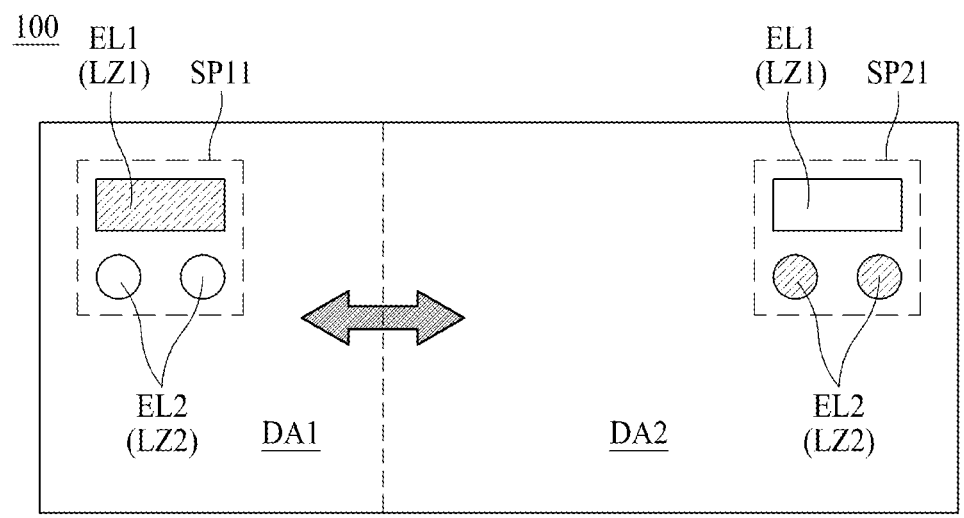
Figure 3C:
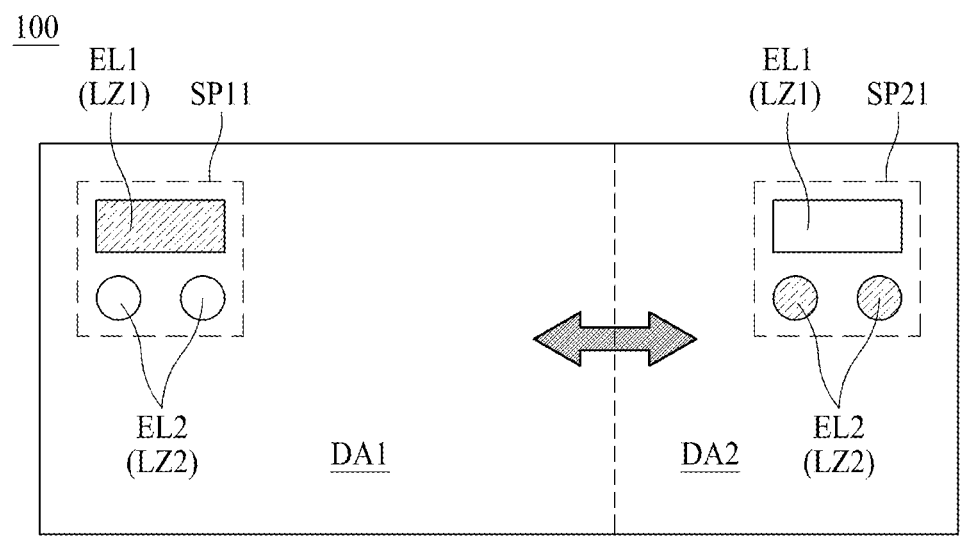
Figure 3D:
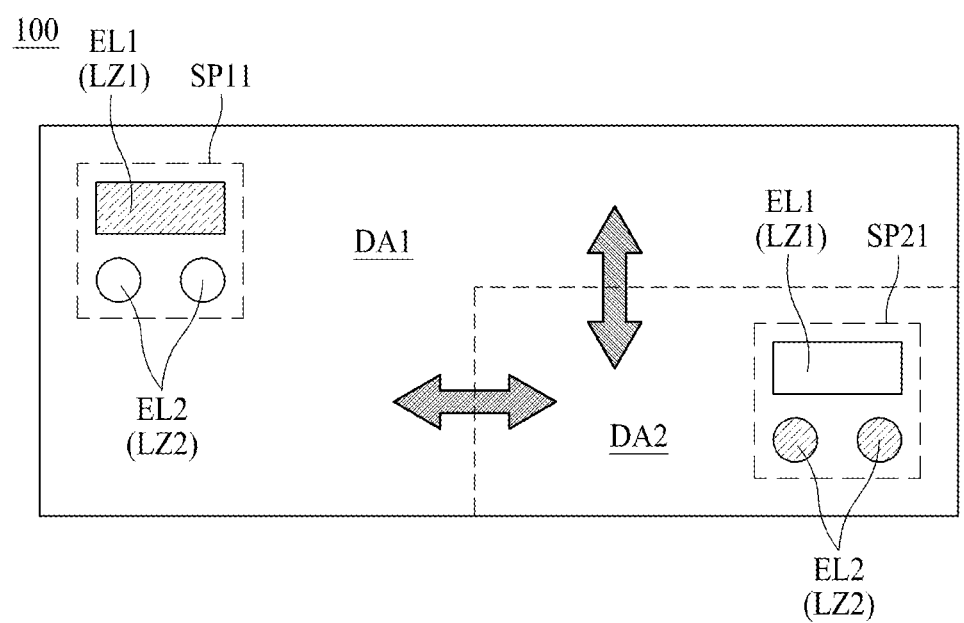
Figure 4A:
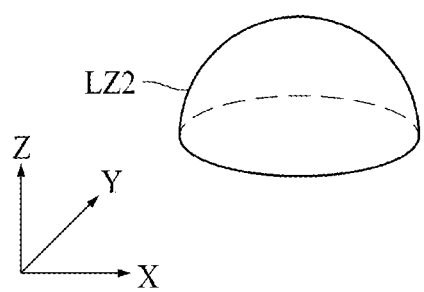
FIGS. 4A and 4B are perspective views illustrating first and second lens structures of a display panel according to an embodiment.
Figure 4B:
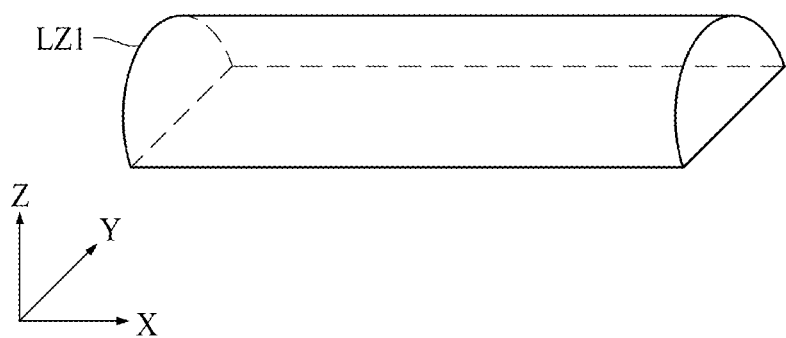

Referring to FIGS. 2 to 3D, the display apparatus 1000 according to an embodiment may be disposed at a center of a vehicular dashboard and may provide an image to all occupants of a vehicle. A display panel 100 of the display apparatus 1000 may include a first area DA1 and a second area DA2, and a ratio or an area of the first area DA1 and the second area DA2 may vary in first and second directions.

In an embodiment, the first area DA1 may be referred to as a center information display (CID) area or a share mode area, and the second area DA2 may be referred to as a co-driver display (CDD) area or a switchable privacy mode area.

As shown in FIG. 2, a display panel of the display apparatus 1000 or the display apparatus itself may be incorporated into a body 1010 of the vehicle 2000. Accordingly, the display apparatus (or the display panel), under normal operation, is not separated or detached from the body 1010 of the vehicle 2000. However, it may be separated in instances where the display needs repair.

The body 1010 of the vehicle 2000 includes a motor 1020 mounted to the body 1010. The motor 1020 may include a combustion engine, an electric motor, or a hybrid system combining an internal combustion engine (usually fueled by gasoline or diesel) with an electric motor, or the like. Accordingly, in some embodiments, the vehicle 2000 may include not only conventional fuel vehicles but also electric vehicles or other vehicles that run on clean energy.

Referring to FIGS. 3A to 4B, each of a subpixel SP11 of the first area DA1 and a subpixel SP21 of the second area DA2 may include a first light emitting device EL1, a second light emitting device EL2, a first lens LZ1 disposed on the first light emitting device EL1, and a second lens LZ2 disposed on the second light emitting device EL2.

In an embodiment, the first lens LZ1 may be disposed in a light traveling path of the first light emitting device EL1. The second lens LZ2 may be disposed in a light traveling path of the second light emitting device EL2.

In each of the subpixels SP11 and SP21, the second light emitting device EL2 may include a plurality of second light emitting devices EL2 or a plurality of second emission regions, a plurality of second lenses LZ2 may be individually disposed in light traveling paths of the plurality of second light emitting devices EL2 or the plurality of second emission regions. In each of the subpixels SP11 and SP21, the plurality of second light emitting devices EL2 or the plurality of second emission regions may be connected with one another in parallel.

In each of the subpixels SP11 and SP21, a region where the first lens LZ1 is disposed may be referred to as a first lens region, and a region where the plurality of second lenses LZ2 are disposed may be referred to as a second lens region.

Referring to FIG. 4A, the first lens LZ1 may be a half-cylindrical lens which extends in a first direction X. Referring to FIG. 4B, the second lens LZ2 may be a half-spherical lens.

In FIGS. 4A and 4B, the first direction X may be referred to as a lateral direction, a widthwise direction, a horizontal direction, or an X-axis direction. A second direction Y may be referred to as an up and down direction, a lengthwise direction, a vertical direction, or a Y-axis direction. A third direction Z may be referred to as a forward and rearward direction, a thickness direction of the display panel 100, or a Z-axis direction.

The first lens LZ1 and the second lens LZ2 may differently control (limit) a viewing angle in a horizontal direction X and may identically control (limit) a viewing angle in a vertical direction Y.

For example, the first lens LZ1 may not limit a traveling path of light, emitted from the first light emitting device EL1, to within a specific angle in the horizontal direction X and thus may control a viewing angle to a wide viewing angle, and the second lens LZ2 may limit a traveling path of light, emitted from the second light emitting device EL2, to within a specific angle in the horizontal direction X and thus may control a viewing angle to a narrow viewing angle.

The first lens LZ1 and the second lens LZ2 may limit a light traveling path to within a specific angle in the vertical direction Y to control a viewing angle to a narrow viewing angle. Accordingly, in an embodiment, when the display apparatus 1000 is applied to a vehicle 2000 as in FIG. 2, an image displayed on each of the first and second areas DA1 and DA2 may be prevented from being reflected by front glass of the vehicle and hindering a field of view of a vehicle driver.

In a case where the first light emitting device EL1 is driven in each of the subpixels SP11 and SP12, a corresponding subpixel may operate in a wide viewing angle mode which does not limit a viewing angle in the horizontal direction X. In a case where the second light emitting device EL2 is driven in each of the subpixels SP11 and SP12, a corresponding subpixel may operate in a narrow viewing angle mode which limits a viewing angle in the horizontal direction X. The wide viewing angle mode may be referred to as a first mode, and the narrow viewing angle mode may be referred to as a second mode.

In each of the subpixels SP11 and SP21, driving of the first light emitting device EL1 and driving of the second light emitting device EL2 may be turned on based on the mode control signals SH and PR (see FIG. 1), and each of the subpixels SP11 and SP21 may switch between wide viewing angle driving and narrow viewing angle driving.

Referring to FIGS. 3A to 3D, the display apparatus 1000 according to an embodiment may selectively drive the first and second light emitting devices EL1 and EL2 in each of the subpixels SP11 and SP12 by using the mode control signals SH and PR (see FIG. 1), and thus, may independently control a viewing angle of each of the first area DA1 and the second area DA2 and may freely adjust a ratio or an area of the first area DA1 and the second area DA2 in the horizontal direction X and the vertical direction Y in the display panel 100.

For example, in the first area DA1 of the display panel 100, the first light emitting device EL1 corresponding to the first lens LZ1 may be driven in each subpixel SP11, and thus, may provide a vehicle driver and an occupant with an image having a wide viewing angle in the horizontal direction.

In the second area DA2 of the display panel 100, the second light emitting device EL2 corresponding to the second lens LZ2 may be driven in each subpixel SP21, and thus, may provide the vehicle driver and the occupant with an image having a narrow viewing angle in the horizontal direction so as not to hinder driving of the vehicle driver.

In an embodiment, when the vehicle driver does not drive the vehicle, in the first area DA1 and the second area DA2 of the display panel 100, the first light emitting device EL1 corresponding to the first lens LZ1 may be driven in the subpixels SP11 and SP21, based on a selection by a user, and thus, may provide the vehicle driver and the occupant with an image having a wide viewing angle in the horizontal direction.

The display apparatus 1000 according to an embodiment is not limited to a vehicular display apparatus and may be applied to various display apparatuses such as a mobile display, a display for information technology (IT), and a display for televisions (TVs).

Figure 5:
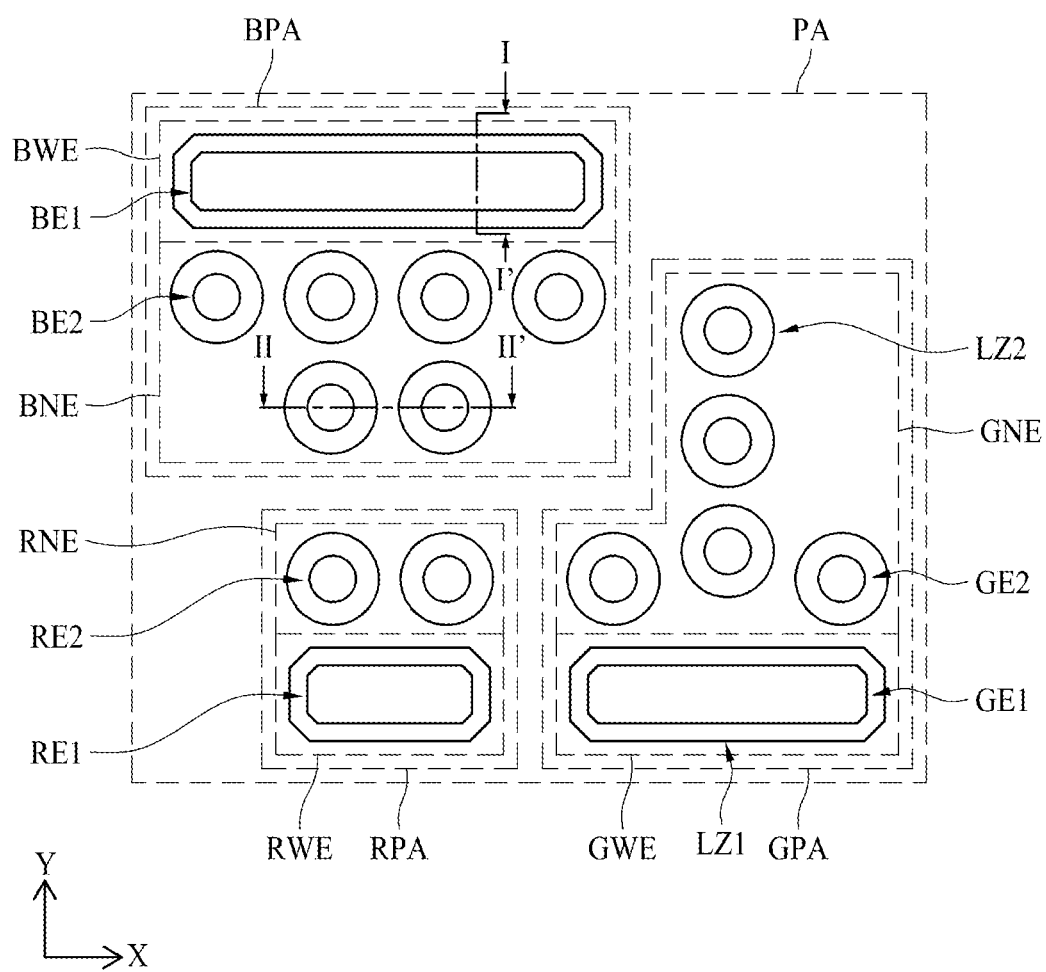
FIG. 5 is a plan view illustrating a pixel structure of a display panel according to an embodiment.
Figure 6:
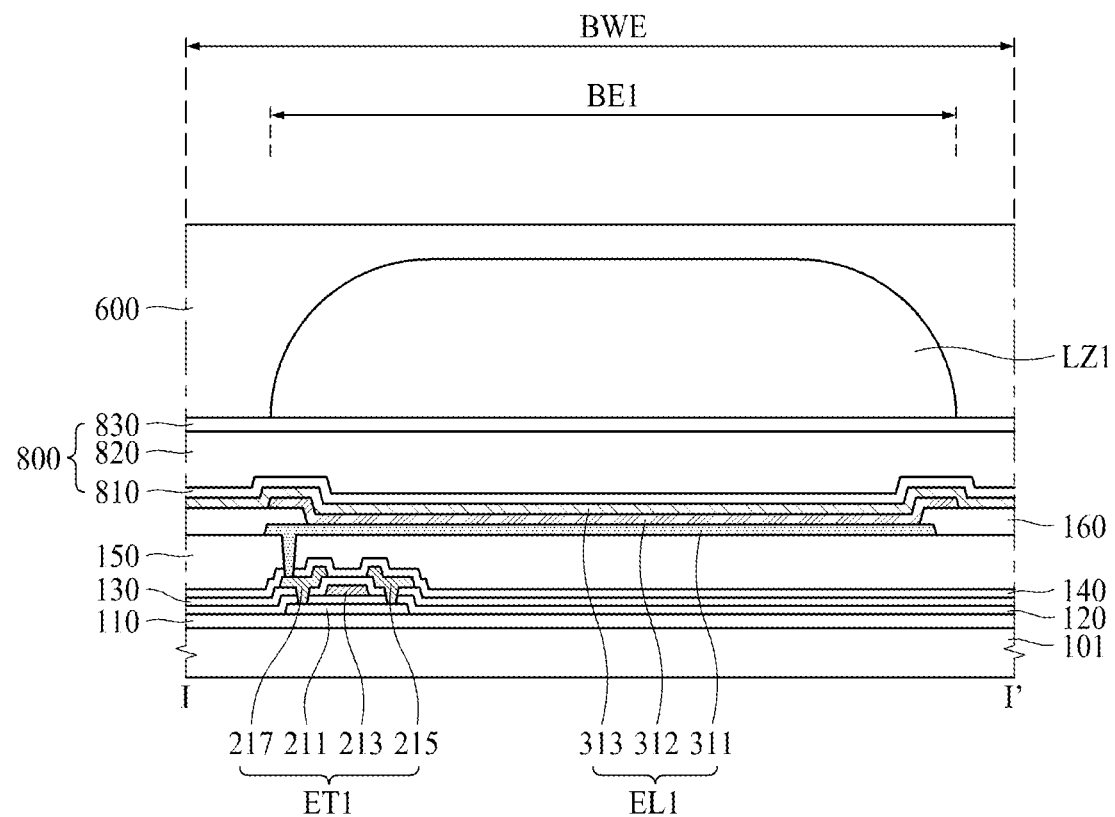
FIG. 6 is a cross-sectional view of a first lens region taken along line I-I' illustrated in FIG. 5.
Figure 7:
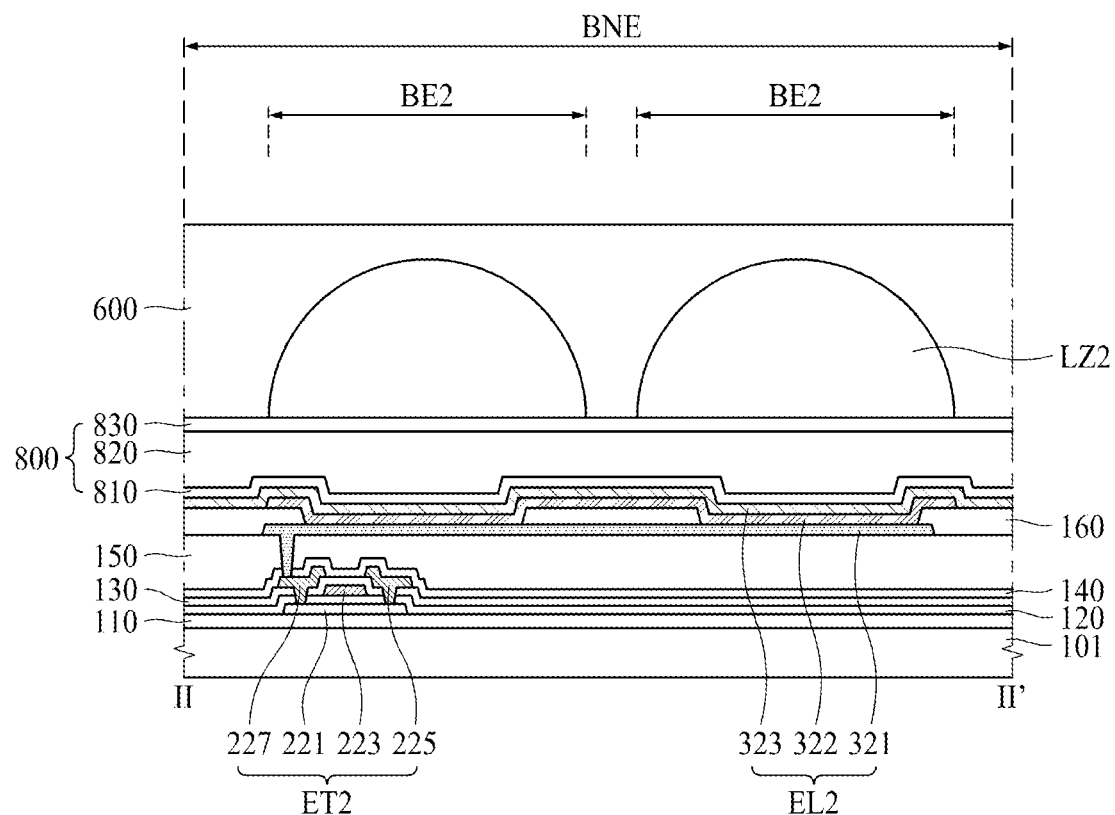
FIG. 7 is a cross-sectional view of a second lens region taken along line II-II' illustrated in FIG. 5.

FIG. 5 is a plan view illustrating a pixel structure of a display panel according to an embodiment, FIG. 6 is a cross-sectional view of a first lens region taken along line I-I' illustrated in FIG. 5, and FIG. 7 is a cross-sectional view of a second lens region taken along line II-II' illustrated in FIG. 5.

Referring to FIG. 5, a pixel area PA or a pixel according to an embodiment may include a blue (B) subpixel area BPA emitting blue light, a red (R) subpixel area RPA emitting red light, and a green (G) subpixel area GPA emitting green light. The R, G, and B subpixel areas RPA, GPA, and BPA may be respectively referred to as a first type subpixel, a second type subpixel, and a third type subpixel.

The B subpixel area BPA may include a first lens region BWE including a first emission region BE1 of the first light emitting device EL1 and a first lens LZ1 disposed to overlap on the first emission region BE1 and a second lens region BNE including a second emission region BE2 of the second light emitting device EL2 and a second lens LZ2 disposed to overlap on the second emission region BE2. As further illustrated in FIG. 6, the first lens LZ1 is disposed above the first emission region BE1 and overlaps the first emission region BE1 from a plan view. Similarly, as illustrated in FIG. 7, the second lens LZ2 is disposed above the second emission region BE2 and overlaps the second emission region BE2 from a plan view.

The R subpixel area RPA may include a first lens region RWE including a first emission region RE1 of the first light emitting device EL1 and a first lens LZ1 disposed to overlap on the first emission region RE1 and a second lens region RNE including a second emission region RE2 of the second light emitting device EL2 and a second lens LZ2 disposed to overlap on the second emission region RE2.

The G subpixel area GPA may include a first lens region GWE including a first emission region GE1 of the first light emitting device EL1 and a first lens LZ1 disposed to overlap on the first emission region GE1 and a second lens region GNE including a second emission region GE2 of the second light emitting device EL2 and a second lens LZ2 disposed to overlap on the second emission region GE2.

The first lens LZ1 and the second lens LZ2, as described above with reference to FIGS. 4A and 4B, may differently control a viewing angle in the horizontal direction X and may identically control a viewing angle in the vertical direction Y.

Each of the first lens regions BWE, RWE, and GWE of the pixel area PA may include one corresponding first emission region of the first emission regions BE1, RE1, and GE1 and one first lens LZ1. Each of the second lens regions BNE, RNE, and GNE of the pixel area PA may include a plurality of second emission regions BE2, RE2, and GE2 and a plurality of second lenses LZ2.

Each of the first emission regions BE1, RE1, and GE1 included in the first lens regions BWE, RWE, and GWE of each pixel area PA may have a shape which is equal or similar to that of a lower surface of the first lens LZ1. A size of the first lens LZ1 may be set to be greater than that of each of the first emission regions BE1, RE1, and GE1 and may enhance the emission efficiency of light emitted from each of the first emission regions BE1, RE1, and GE1.

Each of the second emission regions BE2, RE2, and GE2 included in the second lens regions BNE, RNE, and GNE of each pixel area PA may have a shape which is equal or similar to that of a lower surface of the second lens LZ2. A size of the second lens LZ2 may be set to be greater than that of each of the second emission regions BE2, RE2, and GE2 and may enhance the emission efficiency of light emitted from each of the second emission regions BE2, RE2, and GE2.

In an embodiment, the second emission regions BE2, RE2, and GE2 included in the second lens regions BNE, RNE, and GNE of each pixel area PA may have the same area, and the number of second emission regions BE2, RE2, and GE2 may differ for each of the subpixel areas RPA, GPA, and BPA. For example, the number of second emission regions BE2 disposed in the second lens region BNE of the B subpixel area BPA may be more than the number of second emission regions RE2 disposed in the second lens region RNE of the R subpixel area RPA and may be more than the number of second emission regions GE2 disposed in the second lens region GNE of the G subpixel area GPA. The number of second emission regions GE2 disposed in the second lens region GNE of the G subpixel area GPA may be more than the number of second emission regions RE2 disposed in the second lens region RNE of the R subpixel area RPA. Accordingly, an efficiency deviation between second R, G, and B light emitting devices in each pixel area PA may be complemented based on the number of second emission regions BE2, RE2, and GE2 disposed in the second lens regions BNE, RNE, and GNE of each pixel area PA.

In an embodiment, sizes of the first emission regions BE1, RE1, and GE1 may differ for each of the subpixel areas RPA, GPA, and BPA. For example, a size of a first emission region BE1 of a B subpixel area BPA may be greater than that of a first emission region RE1 of an R subpixel area RPA and may be greater than that of a first emission region GE1 of a G subpixel area GPA. A size of the first emission region GE1 of the G subpixel area GPA may be greater than that of the first emission region RE1 of the R subpixel area RPA. Accordingly, an efficiency deviation between first R, G, and B light emitting devices in each pixel area PA may be complemented based on the number of first emission regions BE1, RE1, and GE1 disposed in the first lens regions BWE, RWE, and GWE of each pixel area PA.

The display panel 100 according to an embodiment, as described above with reference to FIGS. 6 and 7, may include a substrate 101, a circuit device layer which includes transistors ET1 and ET2 disposed on the substrate 101, a light emitting device layer which includes the light emitting devices EL1 and EL2 disposed on the circuit device layer, an encapsulation layer 800 which is disposed on the light emitting device layer, and a lens layer which includes the lenses LZ1 and LZ2 disposed on the encapsulation layer 800. The display panel 100 according to an embodiment may further include a touch sensor layer (not shown) which is disposed between the encapsulation layer 800 and the lens layer. The display panel 100 according to an embodiment may further include a color filter layer (not shown) which includes a black matrix and a color filter disposed between the touch sensor layer and the lens layer.

A cross-sectional structure of the B subpixel area BPA of the R, G, and B subpixel areas RPA, GPA, and BPA in the display panel according to an embodiment will be described with reference to FIGS. 6 and 7 for example. The R, G, and B subpixel areas RPA, GPA, and BPA may have the same cross-sectional structure.

Each subpixel BPA of the display panel according to an embodiment may include the first lens region BWE illustrated in FIG. 6 and the second lens region BNE illustrated in FIG. 7.

Referring to FIG. 6, the first lens region BWE of the subpixel area BPA may include a first mode control transistor ET1 of the pixel circuit, a first light emitting device EL1 connected with the first mode control transistor ET1, and a first lens LZ1 disposed to overlap a first emission region BE1 on the first light emitting device EL1.

Referring to FIG. 7, the second lens region BNE of the subpixel area BPA may include a second mode control transistor ET2 of the pixel circuit, a second light emitting device EL2 connected with the second mode control transistor ET2, and a second lens LZ2 disposed to overlap a plurality of second emission regions BE2 on the second light emitting device EL2.

The display panel according to an embodiment may include a circuit device layer disposed on the substrate 101 and a plurality of insulation layers stacked on the substrate 101. For example, the plurality of insulation layers may include a buffer layer 110, a gate insulation layer 120, an interlayer insulation layer 130, a protection layer 140, and a planarization layer 150.

The substrate 101 may include an insulating material such as glass or plastic. A plastic substrate may include a flexible material. For example, the substrate 101 may include at least one organic insulating material of acrylic resin, epoxy resin, siloxane resin, and polyimide resin.

The buffer layer 110 may include a single-layer or multi-layer structure including an inorganic insulating material such as oxide silicon (SiOx), nitride silicon (SiNx), and oxide aluminum ($Al_2O_3$). The buffer layer 110 may prevent impurities such as hydrogen from penetrating into semiconductor layers 211 and 221 through the substrate 101.

The transistors ET1 and ET2 may be disposed on the buffer layer 110.

The first mode control transistor ET1 may include the semiconductor layer 211, a gate electrode 213, a source electrode 215, and a drain electrode 217, which are disposed on the buffer layer 110. The second mode control transistor ET2 may include the semiconductor layer 221, a gate electrode 223, a source electrode 225, and a drain electrode 227, which are disposed on the buffer layer 110. The gate insulation layer 110 may be disposed between the semiconductor layers 211 and 222 and the gate electrodes 213 and 223. The interlayer insulation layer 130 may be disposed between the gate electrodes 213 and 223 and the source and drain electrodes 215, 217, 225, and 227. The source electrode 215 and the drain electrode 217 of the first mode control transistor ET1 may be respectively connected with a source region and a drain region of the semiconductor layer 211 through contact holes passing through the interlayer insulation layer 130 and the gate insulation layer 110. The source electrode 225 and the drain electrode 227 of the second mode control transistor ET2 may be respectively connected with a source region and a drain region of the semiconductor layer 221 through contact holes passing through the interlayer insulation layer 130 and the gate insulation layer 110.

The semiconductor layers 211 and 221 may include polycrystalline silicon, or may include an oxide semiconductor material. The semiconductor layers 211 and 221 may include low temperature polysilicon (LPTS). The semiconductor layers 211 and 221 may include at least one oxide semiconductor material of indium zinc oxide (IZO (InZnO)), indium gallium oxide (IGO (InGaO)), indium tin oxide (ITO (InSnO)), indium gallium zinc oxide (IGZO (InGaZnO)), indium gallium zinc tin oxide (IGZTO (InGaZnSnO)), gallium zinc tin oxide (GZTO (GaZnSnO)), gallium zinc oxide (GZO (GaZnO)), and indium tin zinc oxide (ITZO (InSnZnO)). A light blocking layer (not shown) may be further provided under the semiconductor layers 211 and 221.

The gate insulation layer 120 may include an inorganic insulating material such as SiOx or SiNx. The gate insulation layer 120 may include a material having a high dielectric constant. For example, the gate insulation layer 120 may include a high-k material such as oxide hafnium (HfO). The gate insulation layer 120 may have a multi-layer structure.

Gate lines (not shown) connected with the gate electrodes 213 and 223 may be disposed on the gate insulation layer 120.

The interlayer insulation layer 130 may include an inorganic insulating material such as SiOx or SiNx. The interlayer insulation layer 130 may have a multi-layer structure.

Power lines (not shown) and data lines (not shown) connected with the source electrodes 215 and 225 or the drain electrodes 217 and 227 may be disposed on the interlayer insulation layer 130.

The protection layer 140 and the planarization layer 150 may be stacked on the first and second mode control transistors ET1 and ET2. The protection layer 140 may include an inorganic insulating material such as SiOx or SiNx. The planarization layer 150 may include an organic insulating material which differs from a material of the protection layer 140 and may provide a flat surface.

The light emitting device layer including the first light emitting device EL1 and the second light emitting device EL2 may be disposed on the planarization layer 150.

The first light emitting device EL1 may include a first electrode 311 disposed on the planarization layer 150, an emission layer 312 disposed on the first electrode 311, and a second electrode 313 disposed on the emission layer 312. The second light emitting device EL2 may include a first electrode 321 disposed on the planarization layer 150, an emission layer 322 disposed on the first electrode 321, and a second electrode 323 disposed on the emission layer 322. The first light emitting device EL1 and the second light emitting device EL2 disposed in each subpixel area BPA may emit lights having the same color.

The first electrode 311 of the first light emitting device EL1 may be connected with one of the source electrode 215 and the drain electrode 217 of the first mode control transistor ET1 through a contact hole passing through the planarization layer 150 and the protection layer 140. The first electrode 321 of the second light emitting device EL2 may be connected with one of the source electrode 225 and the drain electrode 227 of the second mode control transistor ET2 through a contact hole passing through the planarization layer 150 and the protection layer 140.

The first electrodes 311 and 312 may include a conductive material having a high reflectance. The first electrodes 311 and 312 may include metal such as aluminum (Al), silver (Ag), titanium (Ti), or a silver-palladium-copper alloy (APC). The first electrodes 311 and 312 may further include a transparent conductive material such as ITO or IZO. For example, the first electrodes 311 and 312 may have a multi-layer structure (Ti/Al/Ti) of Ti and Al, a multi-layer structure (ITO/Al/ITO) of ITO and Al, or a multi-layer structure (ITO/APC/ITO) of ITO and APC.

The emission layers 312 and 322 may include an emission material layer (EML) including a light emitting material. The light emitting material may include an organic material, an inorganic material, or a hybrid material. The emission layer 312 of the first light emitting device EL1 and the emission layer 322 of the second light emitting device EL2 may be spaced apart from each other. Accordingly, the emission of light caused by a leakage current may be prevented.

The emission layers 312 and 322 may have a multi-layer structure. For example, the emission layers 312 and 322 may further include at least one of a hole injection layer (HIL), a hole transport layer (HTL), an electron transport layer (ETL), and an electron injection layer (EIL).

The second electrodes 313 and 323 may include a conductive material which transmits light. The second electrodes 313 and 323 may include a transparent conductive material such as ITO or IZO. The second electrodes 313 and 323 may include Al, magnesium (Mg), Ag, or an alloy thereof and may have a thin thickness which enables the transmission of light. Accordingly, lights respectively emitted from the emission layers 312 and 322 may be respectively discharged through the second electrodes 313 and 323.

The first electrode 311 of the first light emitting device EL1 may be spaced apart from the first electrode 321 of the second light emitting device EL2, and a bank insulation layer 160 may be disposed between the first electrodes 311 and 321. The bank insulation layer 160 may cover an edge of each of the first electrodes 311 and 321. The bank insulation layer 160 may include an organic insulating material. The bank insulation layer 160 may include an organic material which differs from that of the planarization layer 150 and may have a single-layer or a multi-layer structure.

The bank insulation layer 160 may include an opening portion which exposes the first electrode 311, and thus, may define the first emission region BE1. The emission layer 312 and the second electrode 313 of the first light emitting device EL1 may be stacked on the first electrode 311 exposed by the opening portion of the bank insulation layer 160.

The bank insulation layer 160 may include an opening portion which exposes the first electrode 321 of the second light emitting device EL2, and thus, may define the second emission region BE2. In an embodiment, the bank insulation layer 160 may include a plurality of opening portions provided in the first electrode 321 of the second light emitting device EL2, and thus, may define a plurality of second emission regions BE2. The emission layer 322 and the second electrode 323 of the second light emitting device EL2 may be stacked on the first electrode 321 exposed by the opening portion of the bank insulation layer 160. The emission layer 322 and the second electrode 323 of the second light emitting device EL2 may overlap the first electrode 321 with the bank insulation layer 160 therebetween. The plurality of second emission regions BE2 in the second lens region BNE may be independently disposed apart from each other by the bank insulation layer 160, but may share the first electrode 321 of the second light emitting device EL2, share the emission layer 322 of the second light emitting device EL2, and share the second electrode 323 of the second light emitting device EL2. Accordingly, the emission efficiency of the second emission regions BE2 may be improved. A size of the second emission region BE2 may be less than that of the first emission region BE1.

The second electrode 313 of the first light emitting device EL1 may be a common electrode which is electrically connected with the second electrode 323 of the second light emitting device EL2.

The encapsulation layer 800 may be disposed on the light emitting device layer including the first light emitting device EL1 and the second light emitting device EL2 of each subpixel area BPA. The encapsulation layer 800 may prevent the first and second light emitting devices EL1 and EL2 from being damaged by external water and impact. The encapsulation layer 800 may have a multi-layer structure. For example, the encapsulation layer 800 may include a first encapsulation layer 810, a second encapsulation layer 820, and a third encapsulation layer 830, which are sequentially stacked, but embodiments of the present disclosure are not limited thereto. The first encapsulation layer 810, the second encapsulation layer 820, and the third encapsulation layer 830 may include an insulating material. The second encapsulation layer 820 may include a material which differs from that of each of the first encapsulation layer 810 and the third encapsulation layer 830. For example, the first encapsulation layer 810 and the third encapsulation layer 830 may each be an inorganic encapsulation layer including an inorganic insulating material, and the second encapsulation layer 820 may include an organic encapsulation layer including an organic insulating material. Accordingly, the first and second light emitting devices EL1 and EL2 of the display apparatus may be more effectively prevented from being damaged by external water and impact.

A lens layer including the first lens LZ1 and the second lens LZ2 may be disposed on the encapsulation layer 800 of each subpixel area BPA.

The first lens LZ1 may be disposed on the first emission region BE1 of the first light emitting device EL1 in the first lens region BWE and may not limit a traveling path of light emitted from the first emission region BE1 in a horizontal direction, thereby controlling the traveling path of the light to a wide viewing angle. For example, the first lens LZ1 may not limit the traveling path of the light, emitted from the first emission region BE1 of the first light emitting device EL1, to within a specific angle in a horizontal direction and thus may control the traveling path of the light to a wide viewing angle, and moreover, may limit the traveling path of the light to within a specific angle in a vertical direction and thus may control the traveling path of the light to a narrow viewing angle.

The second lens LZ2 may be disposed on the second emission region BE2 of the second light emitting device EL2 in the second lens region BNE and may limit a traveling path of light emitted from the second emission region BE2 in a horizontal direction, thereby controlling the traveling path of the light to a narrow viewing angle. For example, the second lens LZ2 may limit the traveling path of the light, emitted from the second emission region BE2 of the second light emitting device EL2, in a horizontal direction and thus may control the traveling path of the light to a narrow viewing angle, and moreover, may limit the traveling path of the light in a vertical direction and thus may control the traveling path of the light to a narrow viewing angle.

A lens protection layer 600 may be disposed on the first lens LZ1 and the second lens LZ2 of each subpixel area BPA. The lens protection layer 600 may include an organic insulating material. A refractive index of the lens protection layer 600 may be less than a refractive index of the first lens LZ1 and a refractive index of the second lens LZ2. Accordingly, light passing through the first lens LZ1 and the second lens LZ2 may not be reflected in a direction toward the substrate 101, based on a refractive index difference with the lens protection layer 600.

Figure 8:
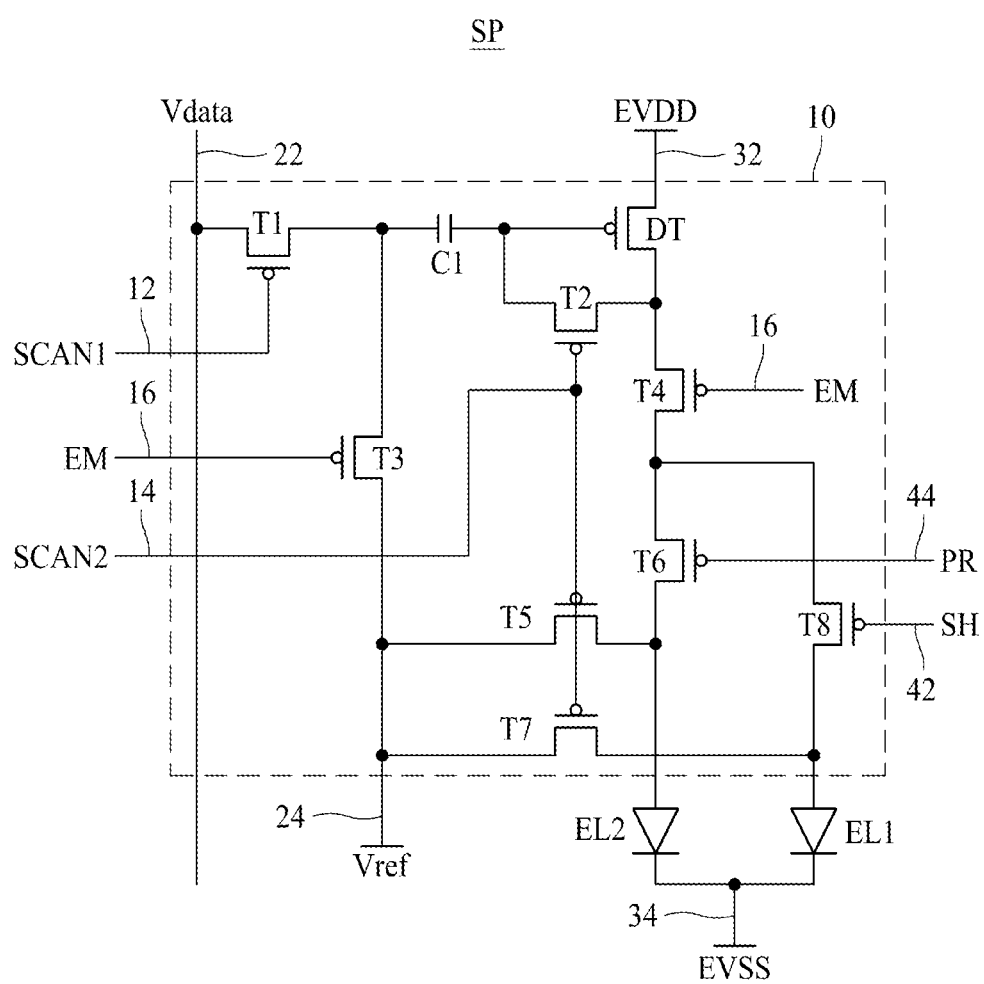
FIG. 8 is an equivalent circuit diagram illustrating a structure of a subpixel in a display panel according to an embodiment.

FIG. 8 is an equivalent circuit diagram illustrating a circuit configuration of each subpixel in a display panel according to an embodiment.

Referring to FIG. 8, each subpixel SP may include a pixel circuit 10, including a plurality of transistors DT and T1 to T8 and first and second light emitting devices EL1 and EL2, and a first lens LZ1 and a second lens LZ2 respectively disposed on the first and second light emitting devices EL1 and EL2.

The pixel circuit 10 of the subpixel SP illustrated in FIG. 8 may include eight switching transistors T1 to T8, a driving transistor DT, a storage capacitor C1, and the first and second light emitting devices EL1 and EL2, but a configuration thereof is not limited thereto. A first mode control transistor T8 of FIG. 8 may correspond to the first mode control transistor ET1 of FIG. 6, and a second mode control transistor T6 of FIG. 8 may correspond to the second mode control transistor ET2 of FIG. 7.

The pixel circuit 30 of each subpixel SP may be driven to include an initialization period, a sampling and program period, and an emission period in each frame period.

In each subpixel SP, the first light emitting device EL1 may be driven by the first mode control transistor T8 controlled by a first mode control signal SH, and the second light emitting device EL2 may be driven by the second mode control transistor T6 controlled by a second mode control signal PR. The first lens LZ1 arranged in a light traveling direction of the first light emitting device EL1 may control a horizontal-direction viewing angle to a wide viewing angle. The second lens LZ2 arranged in a light traveling direction of the second light emitting device EL2 may control a horizontal-direction viewing angle to a narrow viewing angle.

Each of the transistors DT and T1 to T8 of each subpixel SP may include a gate electrode, a source electrode, and a drain electrode. The source electrode and the drain electrode may not be fixed and may be changed based on a direction of a current and a voltage applied to the gate electrode, and thus, one of the source electrode and the drain electrode may be referred to as a first electrode and the other electrode may be referred to as a second electrode. The transistors DT and T1 to T8 of each subpixel SP may include at least one of a polysilicon semiconductor, an amorphous silicon semiconductor, and an oxide semiconductor. The transistors may be a P type or an N type, or may be a combination of the P type and the N type.

Each of the first and second light emitting devices EL1 and EL2 may include an anode electrode which is individually connected with each of the mode control transistors T8 and T6, a cathode electrode which is supplied with a second source voltage EVSS (a low level source voltage) through a second power line 34, and an emission layer between the anode electrode and the cathode electrode. The anode electrode may be an independent electrode for each light emitting device, but the cathode electrode may be a common electrode which is shared by all light emitting devices. In each of the first and second light emitting devices EL1 and EL2, when a driving current is supplied from the driving transistor DT through each of the mode control transistors T8 and T6, an electron from the cathode electrode may be injected into the emission layer and a hole from the anode electrode may be injected into the organic emission layer, and thus, a fluorescent or phosphorus material may emit light on the basis of a combination of the electron and the hole in the emission layer, thereby emitting light having brightness proportional to a current value of the driving current.

A first electrode of the driving transistor DT may be connected with a first power line 17 which transfers the first source voltage EVDD. The first source voltage EVDD may be supplied from the power management circuit 700. A second electrode of the driving transistor DT may be connected with first electrodes of first and second mode control transistors T8 and T6 through a fourth switching transistor T4 in common. The driving transistor DT may drive the first light emitting device EL1 through the fourth switching transistor T4 and the first mode control transistor T8, or may drive the second light emitting device EL2 through the fourth switching transistor T4 and the second mode control transistor T6. The driving transistor DT may control a driving current Ids, based on a driving voltage Vgs of the storage capacitor C1, and thus, may control the emission strength of the first light emitting device EL1 or the second light emitting device EL2 through the first mode control transistor T8 or the second mode control transistor T6.

The storage capacitor C1 may be connected between the gate electrode and the first electrode of the driving transistor DT and may be charged with the driving voltage Vgs corresponding to a data voltage Vdata. The storage capacitor C1 may hold the charged driving voltage Vgs during an emission period where the first switching transistor T1 is turned off and may supply the driving voltage Vgs to the driving transistor DT.

The first switching transistor T1 may be turned on or off in response to a first scan signal SCAN1 supplied to a first gate line 12 disposed in an $N^{th}$ (where N may be a natural number) pixel row line. In response to the first scan signal SCAN1, the first switching transistor T1 may transfer the data voltage Vdata, supplied through a data line 22, to a first electrode of the storage capacitor CI during the sampling and program period. The first scan signal SCAN1 may be supplied from a scan driver (210 of FIG. 1).

Second, fifth, and seventh switching transistors T2, T5, and T7 may be turned on or off in response to a second scan signal SCAN2 supplied to a second gate line 14 disposed in the $N^{th}$ pixel row line. The second scan signal SCAN2 may be supplied from the scan driver (210 of FIG. 1).

In response to the second scan signal SCAN2, during the initialization period and the sampling and program period, the second switching transistor T2 may connect the gate electrode and the second electrode (or a drain electrode) of the driving transistor DT with each other, and thus, may connect the driving transistor DT in a diode structure. The second switching transistor T2 may allow the storage capacitor C1 to be charged with a threshold voltage Vth of the driving transistor DT, thereby compensating for the threshold voltage Vth of the driving transistor DT. Accordingly, the storage capacitor C1 may be charged with a data voltage "Vdata+Vth" which is obtained by compensating for the threshold voltage Vth of the driving transistor DT, during the sampling and program period.

In response to the second scan signal SCAN2, during the initialization period and the sampling and program period, the fifth switching transistor T5 may transfer an initialization voltage Vref (or a reference voltage), supplied through an initialization voltage line 24, to the anode electrode of the second light emitting device EL2.

In response to the second scan signal SCAN2, during the initialization period and the sampling and program period, the seventh switching transistor T7 may transfer the initialization voltage Vref (or the reference voltage), supplied through an initialization voltage line 24, to the anode electrode of the first light emitting device EL1.

The third and fourth switching transistors T3 and T4 may be turned on or off in response to an emission control signal EM supplied to a third gate line 16 disposed in the $N^{th}$ pixel row line. The emission control signal EM may be supplied from an emission control driver (220 of FIG. 1).

In response to the emission control signal EM, during the initialization period and the emission period, the third switching transistor T3 may transfer the initialization voltage Vref (or the reference voltage), supplied through the initialization voltage line 24, to the first electrode of the storage capacitor C1.

In response to the emission control signal EM, during the initialization period and the emission period, the fourth switching transistor T4 may connect the driving transistor DT with the first and second mode control transistors T8 and T6.

The first mode control transistor T8 may be controlled by the first mode control signal SH and may be turned on or off, and the second mode control transistor T6 may be controlled by a second mode control signal PR and may be turned on or off.

In the share mode or the wide viewing angle mode where the first mode control signal SH is activated, the first mode control transistor T8 may connect the driving transistor DT with the first light emitting device EL1 during the emission period where the fourth switching transistor T4 is turned on by the emission control signal EM. Accordingly, the first light emitting device EL1 may be driven with a driving current from the driving transistor DT to emit light, and thus, the subpixel SP may emit light at a wide viewing angle through the first lens LZ1.

In the privacy mode or the narrow viewing angle mode where the second mode control signal PR is activated, the second mode control transistor T6 may connect the driving transistor DT with the second light emitting device EL2 during the emission period where the fourth switching transistor T4 is turned on by the emission control signal EM. Accordingly, the second light emitting device EL2 may be driven with a driving current from the driving transistor DT to emit light, and thus, the subpixel SP may emit light at a narrow viewing angle through the second lens LZ2.

The first and second mode control signals SH and PR may be supplied from the data driver 300 or the mode controller (not shown). When each subpixel SP operates in the wide viewing angle mode, the first mode control signal SH may be activated to a gate on voltage, and the second mode control signal PR may be deactivated to a gate off voltage. When each subpixel SP operates in the narrow viewing angle mode, the first mode control signal SH may be deactivated to the gate off voltage, and the second mode control signal PR may be activated to the gate on voltage.

Figure 9:
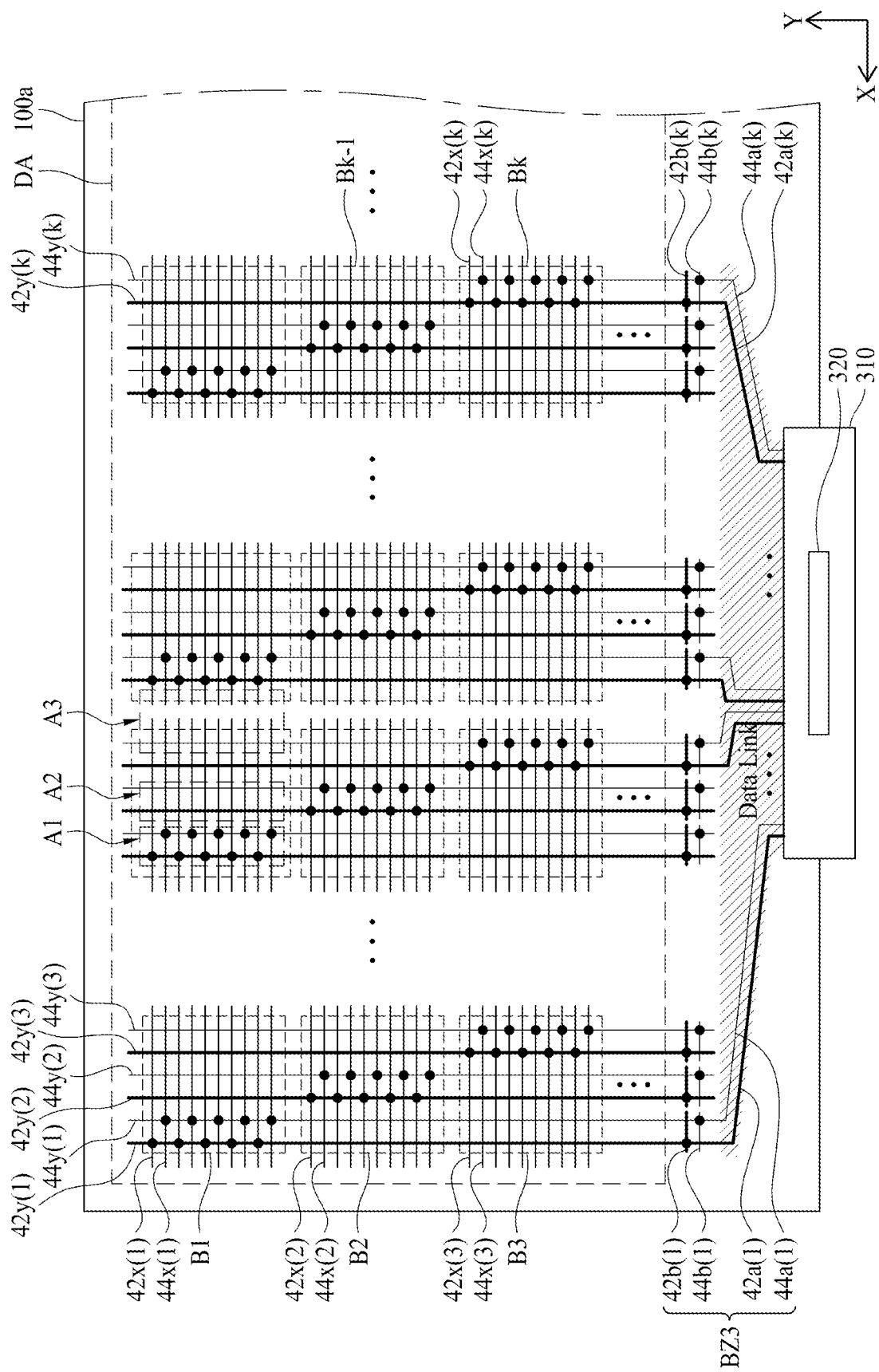
FIG. 9 is a diagram illustrating a schematic arrangement structure of first and second mode control lines in some regions of a display panel according to an embodiment.
Figure 10:
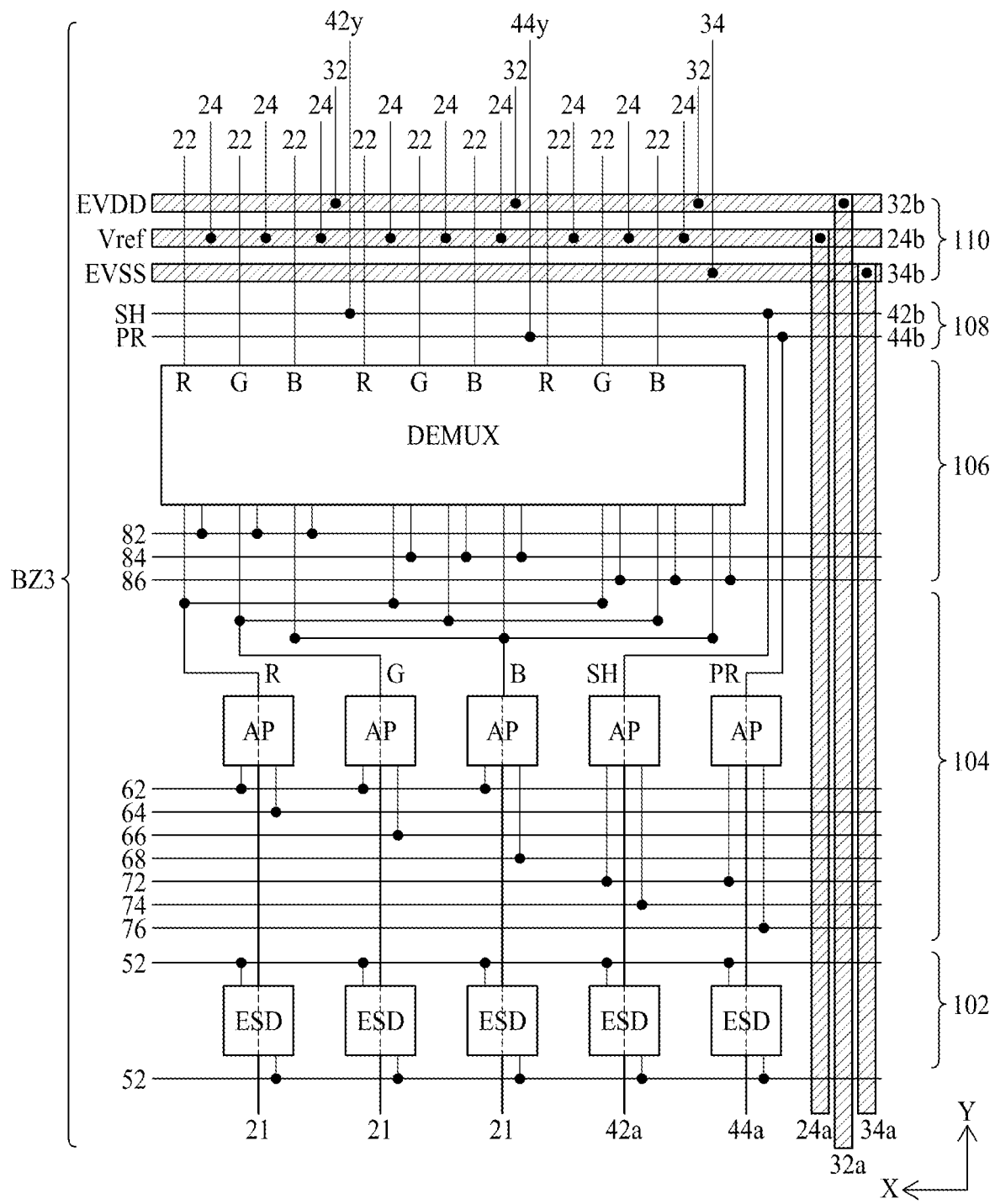
FIG. 10 is a diagram illustrating a schematic arrangement structure of a bezel area illustrated in FIG. 9.

FIG. 9 is a diagram illustrating a schematic arrangement structure of first and second mode control lines in some regions of a display panel according to an embodiment, and FIG. 10 is a diagram illustrating a schematic arrangement structure of a bezel area illustrated in FIG. 9.

Referring to FIG. 9, in a display apparatus according to an embodiment, an arrangement structure of a COF 310 on which one data driver IC 320 of a plurality of data drive ICs is mounted and first and second mode control lines 42 and 44 in some regions of a display panel 100a driven by the data drive IC 320 is schematically illustrated.

A first mode control line 42(n) (where n=1, 2, 3, ..., and k) for transferring a first mode control signal SH may include first mode control lines 42x(n) and 42y(n) (where n=1, 2, 3, ..., and k) of a first type and a second type disposed in a display area DA and first mode control lines 42a(n) and 42b(n) (where n=1, 2, 3, ..., and k) of a third type and a fourth type disposed in a bezel area BZ3. A second mode control line 44(n) (where n=1, 2, 3, ..., and k) for transferring a second mode control signal PR may include second mode control lines 44x(n) and 44y(n) (where n=1, 2, 3, ..., and k) of the first type and the second type disposed in the display area DA and second mode control lines 44a(n) and 44b(n) (where n=1, 2, 3, ..., and k) of the third type and the fourth type disposed in the bezel area BZ3.

In a third bezel area BZ3 where the COF 310 is disposed, mode control lines 42a(n) and 44a(n) of the third type and mode control lines 42b(n) and 44b(n) of the fourth type may be disposed in a data link region between the COF 310 and the display area DA. The mode control lines 42a(n) and 44a(n) of the third type may be connected with the mode controller (not shown) disposed on a printed circuit board (PCB) (not shown) or the data drive IC 320 through the COF 310. The mode control lines 42b(n) and 44b(n) of the fourth type may be arranged in a first direction X in the third bezel area BZ3 and may be respectively connected with the mode control lines 42a(n) and 44a(n) of the third type.

In the third bezel area BZ3, the mode control lines 42a(n) and 44a(n) of the third type may be disposed in the data link region, and the mode control lines 42b(n) and 44b(n) of the fourth type may be arranged apart from each other in the first direction X. For example, fourth type mode control lines 42b(1) and 44b(1) of a first set may be arranged apart from and in parallel with a fourth type mode control lines 42b(2) and 44b(2) of a second set, which are adjacent thereto in the first direction X, in the first direction X. Accordingly, an increase in the third bezel area BZ3 caused by the mode control lines 42a(n) and 44a(n) of the third type and the mode control lines 42b(n) and 44b(n) of the fourth type may be minimized.

First and second mode control lines 42y(n) and 44y(n) of the second type arranged in a second direction Y in the display area DA may be respectively connected with first and second mode control lines 42b(n) and 44b(n) of the third type of the bezel area BZ3. First and second mode control lines 42x(n) and 44x(n) of the first type arranged in the first direction X in the display area DA may be connected with subpixels and may be respectively connected with the first and second mode control lines 42y(n) and 44y(n) of the second type arranged in the second direction Y.

A display area DA of each of display panels 100a and 100b according to an embodiment may include a plurality of pixel blocks B1 to Bk which enable a viewing angle to be independently controlled. Each of the plurality of pixel blocks B1 to Bk may be driven in an independent viewing angle by each of a plurality of mode control sets including mode control lines 42x(1) to 42x(k), 42y(1) to 42y(k), 44x(1) to 44x(k), and 44y(1) to 44y(k).

For example, a first pixel block B1 may be connected with a first mode control set 42(1) and 44(1) including a first-1 mode control line 42(1) (42a(1), 42b(1), 42y(1), and 42x(1)) and a second-1 mode control line 44(1) (44a(1), 44b(1), 44y(1), and 44x(1)) and may be driven in the wide viewing angle mode or the narrow viewing angle mode by the first mode control set 42(1) and 44(1). A second pixel block B2 may be connected with a second mode control set 42(2) and 44(2) including a first-2 mode control line 42(2) (42a(2), 42b(2), 42y(2), and 42x(2)) and a second-2 mode control line 44(2) (44a(2), 44b(2), 44y(2), and 44x(2)) and may be driven in the wide viewing angle mode or the narrow viewing angle mode by the second mode control set 42(2) and 44(2). Similarly, a $k^{th}$ pixel block Bk may be connected with a $k^{th}$ mode control set 42(k) and 44(k) including a first-k mode control line 42(k) (42a(k), 42b(k), 42y(k), and 42x(k)) and a second-k mode control line 44(k) (44a(k), 44b(k), 44y(k), and 44x(k)) and may be driven in the wide viewing angle mode or the narrow viewing angle mode by the $k^{th}$ mode control set 42(k) and 44(k).

Second type mode control lines 42y(n) and 44y(n) arranged in the second direction Y in each of the plurality of pixel blocks B1 to Bk may extend up to the other pixel blocks arranged in the same column in the second direction Y and may have similar lengths in the display area DA.

The second type mode control lines 42y(n) and 44y(n) in the second direction Y may be connected with first type mode control lines 42x(n) and 44x(n) in the first direction X through a contact hole of an insulation layer in a first type pixel area A1 and may have a structure where the first type mode control lines 42x(n) and 44x(n) and the second type mode control lines 42y(n) and 44y(n) overlap with each other with the insulation layer therebetween.

The second type mode control lines 42y(n) and 44y(n) in the second direction Y may have a structure where the second type mode control lines 42y(n) and 44y(n) overlap with first type mode control lines in the first direction X with the insulation layer therebetween without being connected with each other.

First type mode control lines $42x(n)$ and $44x(n)$ arranged in the first direction X in each of the plurality of pixel blocks B1 to Bk may have a structure where the first type mode control lines $42x(n)$ and $44x(n)$ are disconnected from first type mode control lines of the other pixel block adjacent thereto in the first direction X, as in a third type pixel area A3.

Referring to FIG. 10, in the display panel 100a according to an embodiment, the third bezel area BZ3 may include an electrostatic discharge circuit (ESD) region 102, a lighting test circuit (AP) region 104, a de-multiplexer circuit (DE-MUX) region 106, mode control line regions 108 and 118, and a power line region 110, which are arranged in the second direction Y between the display area DA and a pad area where the COF 310 is disposed.

A plurality of data input lines 21, first and second mode control lines 42a and 44a, and power input lines 24a, 32a, and 34a, which are connected with the COF 310 through the pad area, may be arranged in parallel in the first direction X in the electrostatic discharge circuit (ESD) region 102 and the lighting test circuit (AP) region 104 and may be disposed to extend in the second direction Y.

Electrostatic discharge circuits (ESD) including a plurality of transistors may be respectively connected with a plurality of data input lines 21 and first and second mode control lines 42a and 44a of the third type, which are disposed in the electrostatic discharge circuit (ESD) region 102. When static electricity flows in through one of the plurality of data input lines 21 and the first and second mode control lines 42a and 44a of the third type, each of the electrostatic discharge circuits (ESD) may operate to discharge static electricity through an electrostatic discharge line 52.

Lighting test circuits (AP) including a plurality of transistors may be respectively connected with the plurality of data input lines 21 and the first and second mode control lines 42a and 44a of the third type, which are disposed in the lighting test circuit (AP) region 104. The lighting test circuits (AP) may be connected with control lines 62 and 72 and test signal supply lines 64, 66, 68, 74, and 76.

A de-multiplexer circuit (DEMUX) disposed in the de-multiplexer circuit (DEMUX) region 106 may distribute and supply data signals R, G, and B, supplied through the plurality of data input lines 21, to more data lines 22 than the number of data input lines 21. The de-multiplexer circuit (DEMUX) may include a plurality of transistors which are connected with a plurality of control lines 82, 84, and 86 to perform a switching operation.

For example, the de-multiplexer circuit (DEMUX) may time-divisionally and sequentially supply R data signals, sequentially supplied through one R data input line 21, to three R data lines 22. The de-multiplexer circuit (DEMUX) may time-divisionally and sequentially supply G data signals, sequentially supplied through one G data input line 21, to three G data lines 22. The de-multiplexer circuit (DEMUX) may time-divisionally and sequentially supply B data signals, sequentially supplied through one B data input line 21, to three B data lines 22.

In the de-multiplexer circuit (DEMUX) region 106, the first and second mode control lines 42a and 44a of the third type disposed between the de-multiplexer circuit (DEMUX) and the power input lines 24a, 32a, and 34a may extend in the second direction Y.

The first and second mode control lines 42a and 44a of the third type may be respectively connected with first and second mode control lines 42b and 44b of the fourth type extending in the first direction X in the mode control line regions 108 and 118. The first and second mode control lines 42b and 44b of the fourth type may be respectively connected with first and second mode control lines 42y and 44y of the second type disposed in the display area DA in the second direction Y and may respectively supply the first and second mode control signals SH and PR.

The power input lines 24a, 32a, and 34a may be respectively connected with power supply lines 24b, 32b, and 34b arranged in the first direction X in the power line region 110. The power supply lines 24b, 32b, and 34b may be respectively connected with power lines 24, 32, and 34 arranged in the second direction Y in the display area DA and may respectively supply an initialization voltage Vref and first and second source voltages EVDD and EVSS.

Figure 11:
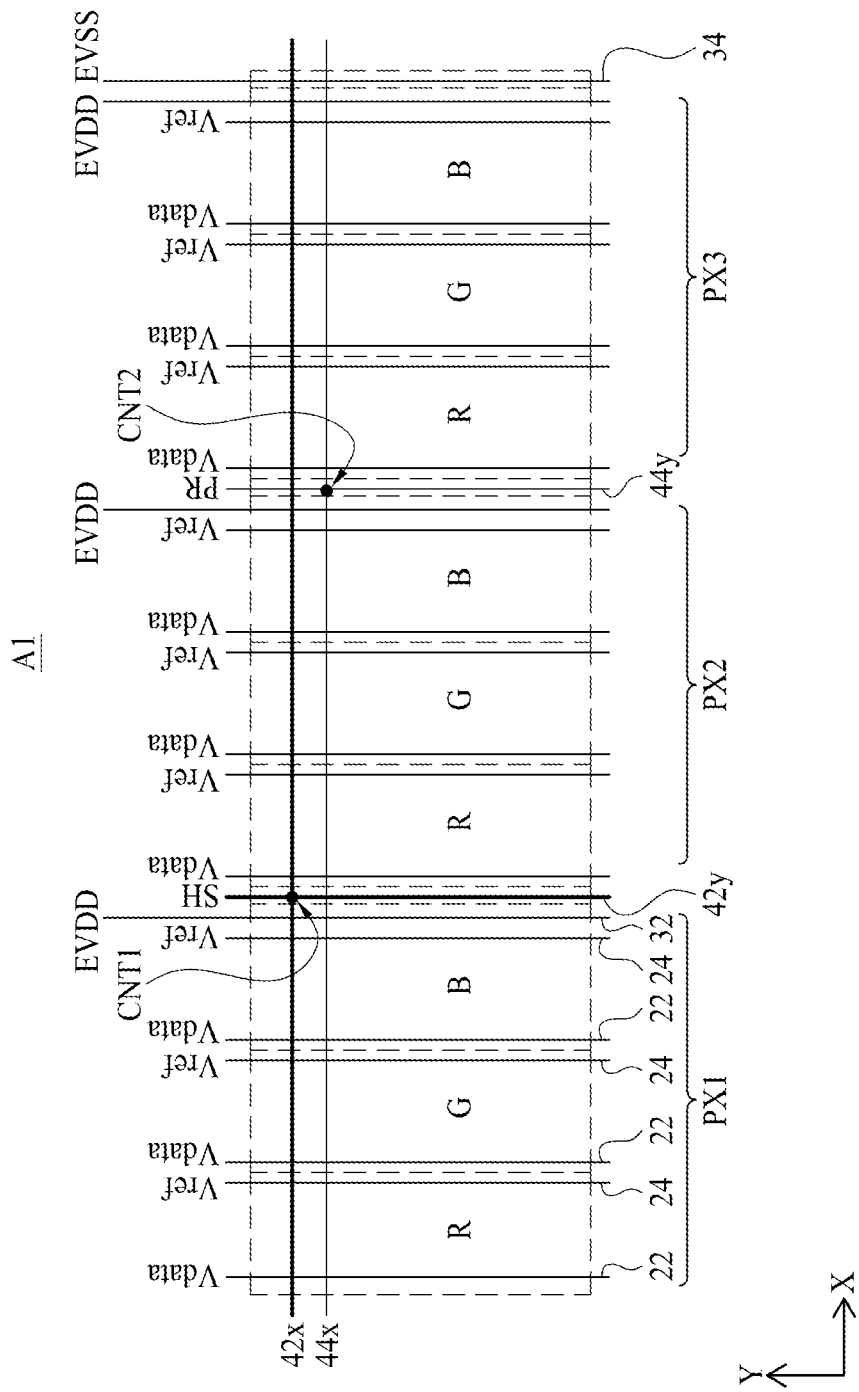
FIG. 11 is a diagram illustrating an arrangement structure of main signal lines in a first type pixel area illustrated in FIG. 9.
Figure 12:
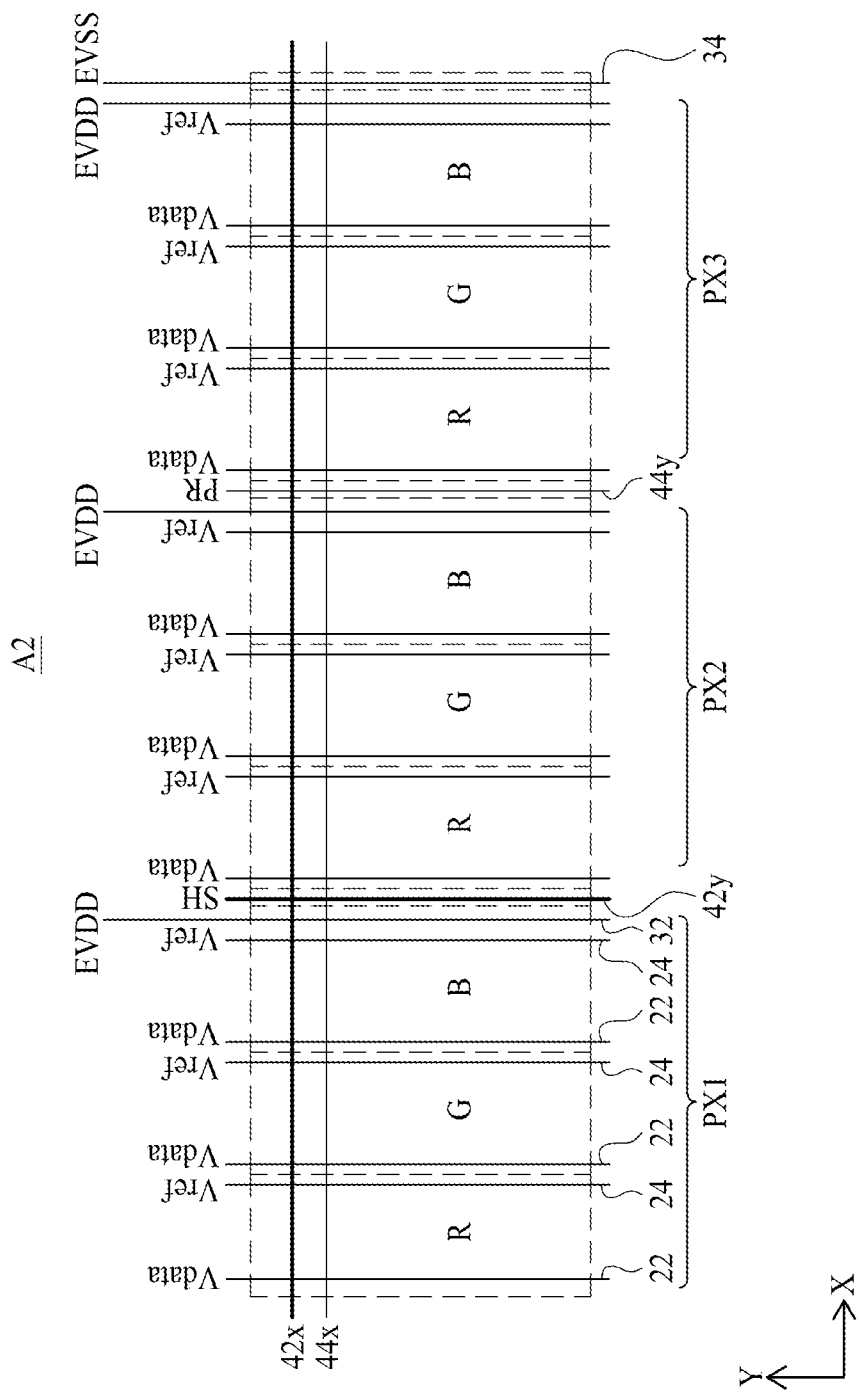
FIG. 12 is a diagram illustrating an arrangement structure of main signal lines in a second type pixel area illustrated in FIG. 9.
Figure 13:
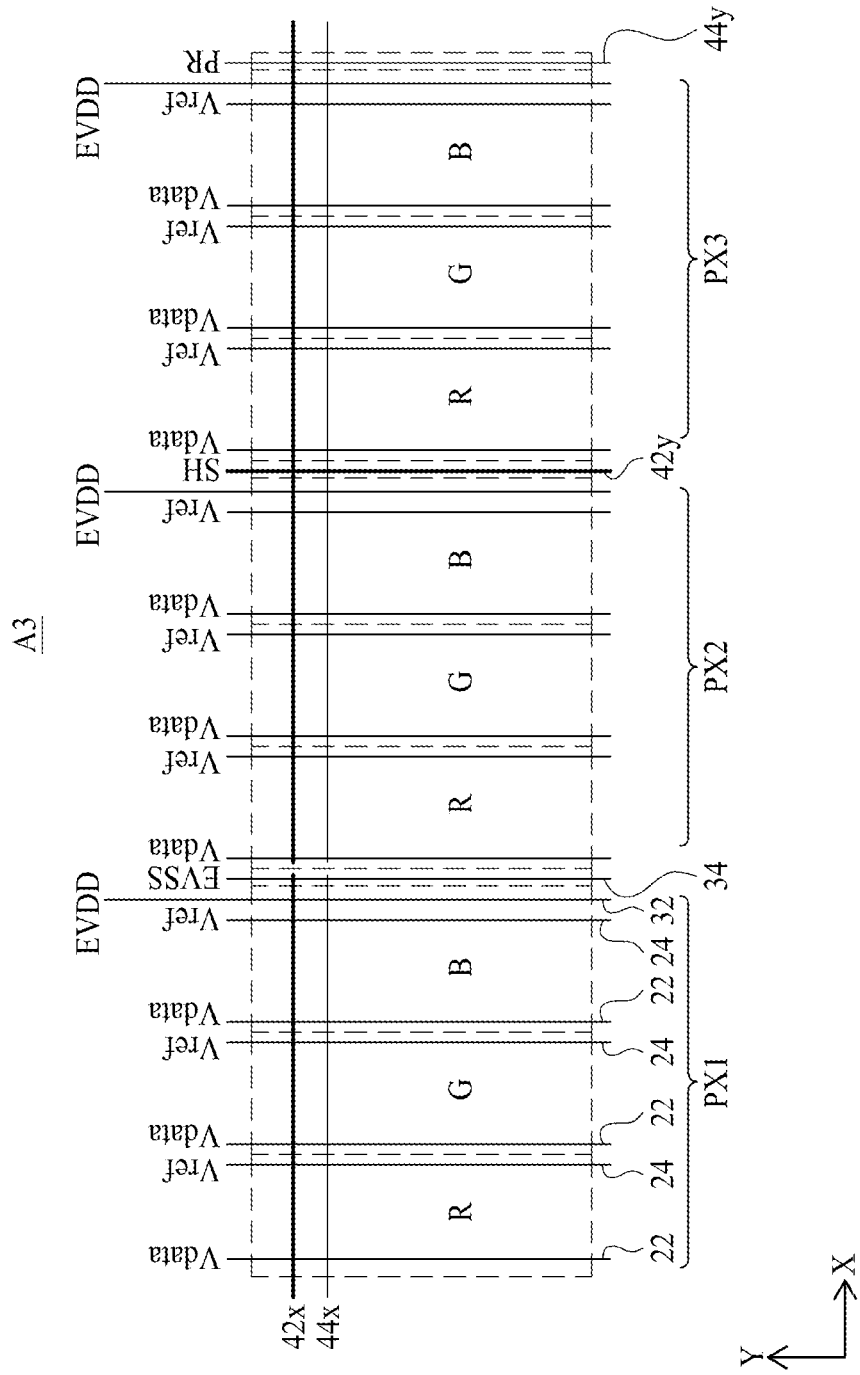
FIG. 13 is a diagram illustrating an arrangement structure of main signal lines in a third type pixel area illustrated in FIG. 9.

FIGS. 11 to 13 are diagrams illustrating an arrangement structure of main signal lines in pixel areas A1 to A3 of first to third types illustrated in FIG. 9.

Referring to FIGS. 11 to 13, each of pixels PX1 to PX3 disposed in the pixel areas A1 to A3 of the first to third types may include red, green, and blue subpixels R, G, and B arranged in a first direction X. A data line 22 for transferring a data voltage Vdata and an initialization voltage line 24 for transferring an initialization voltage Vref may be disposed to extend in a second direction Y in each of the red, green, and blue subpixels R, G, and B.

One of a first mode control line 42y of the second type transferring a first mode control signal SH, a second mode control line 44y of the second type transferring a second mode control signal PR, and a second power line 34 transferring a second source voltage EVSS may be alternately arranged between two adjacent pixels of the pixels PX1 to PX3. A first power line 32 shared by first to third subpixels SP1 to SP3 may be disposed between two adjacent pixels of the pixels PX1 to PX3. The first power line 32, the first mode control line 42y of the second type, the second mode control line 44y of the second type, and the second power line 34 may extend in the second direction Y.

For example, the first power line 32 and the first mode control line 42y of the second type may be disposed between first and second pixels PX1 and PX2. The first power line 32 and the first mode control line 42y of the second type may be arranged in parallel between an initialization voltage line 24 disposed in a blue subpixel B of the first pixel PX1 and a data line 22 disposed in a red subpixel R of the second pixel PX2. The first power line 32 and the second mode control line 44y of the second type may be disposed between the second pixel PX2 and the third pixel PX3. The first power line 32 and the second mode control line 44y of the second type may be arranged in parallel between an initialization voltage line 24 disposed in a blue subpixel B of the second pixel PX2 and a data line 22 disposed in a red subpixel R of the third pixel PX3. The first power line 32 and the second power line 34 may be disposed between the third pixel PX3 and the first pixel PX1. The first power line 32 and the second power line 34 may be arranged in parallel between an initialization voltage line 24 disposed in a blue subpixel B of the third pixel PX3 and a data line 22 disposed in a red subpixel R of the first pixel PX1.

As described above, one of the first mode control line 42y of the second type, the second mode control line 44y of the second type, and the second power line 34 may be arranged between unit pixels PX1 to PX3 in parallel with the first power line 32, and the first mode control line 42y of the second type, the second mode control line 44y of the second type, and the second power line 34 may be alternately arranged, thereby more decreasing a pixel pattern density than a case where the first and second mode control lines 42y and 44y and the first and second power lines 32 and 34 are arranged in parallel between unit pixels.

Referring to FIG. 11, in a first type pixel area A1, a first mode control line 42y and a second mode control line 44y of the second type arranged in the second direction Y may be connected with a first mode control line 42x and a second mode control line 44x of the first type, arranged in the first direction X, through contact holes CNT1 and CNT2 of an insulation layer. A first contact hole CNT1 may be disposed between first and second pixels PX1 and PX2, and a second contact hole CNT2 may be disposed between the second pixel PX2 and a third pixel PX3. The first mode control line 42x and the second mode control line 44x of the first type arranged in the first direction X may be connected with a plurality of subpixels R, G, and B.

Referring to FIG. 12, in a second type pixel area A2, a first mode control line 42y and a second mode control line 44y of the second type arranged in the second direction Y may overlap with a first mode control line 42x and a second mode control line 44x of the first type arranged in the first direction X with at least one insulation layer therebetween without being connected. As shown in the figures, the second type pixel area A2 is adjacent to the first type pixel area A1. In one embodiment, the first mode control line 42x of the first type overlaps with the first mode control line 42y of the second type with an insulation layer therebetween such that the first mode control line 42x of the first type and the first mode control line 42y of the second type are electrically isolated from each other in the second type pixel area A2. Similarly, the second mode control line 44x of the first type overlaps with the second mode control line 44y of the second type with the insulation layer therebetween such that the first mode control line 44x of the first type and the first mode control line 44y of the second type are electrically isolated from each other in the second type pixel area A2.

Referring to FIG. 13, in a third type pixel area A3, a first mode control line 42x and a second mode control line 44x of the first type arranged in the first direction X may be disconnected with respect to a second power line 34, between a first pixel PX1 and a second pixel PX2. A first mode control line 42y and a second mode control line 44y of the second type arranged in the second direction Y may overlap with the first mode control line 42x and the second mode control line 44x of the first type arranged in the first direction X with at least one insulation layer therebetween without being connected. As shown in the figures, the third type pixel area A3 is adjacent to the second type pixel area A2 and is spaced apart from the first type pixel area A1 in the X-direction.

Figure 14:
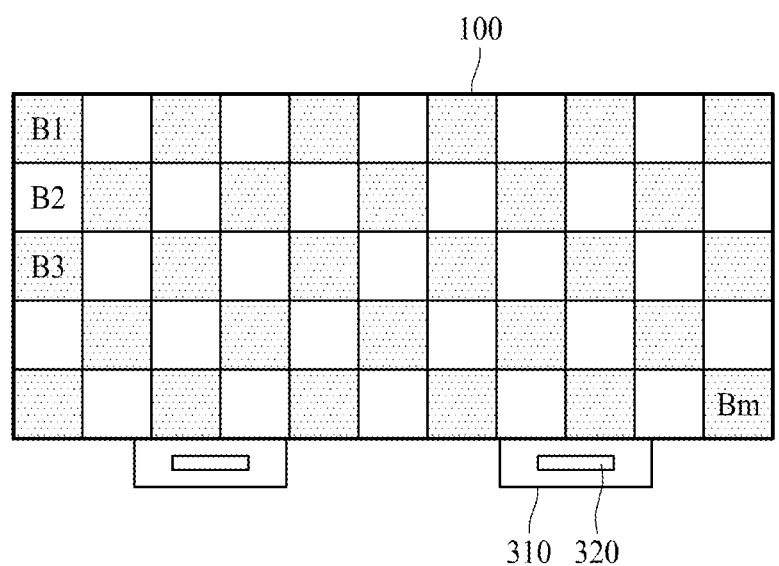
FIG. 14 is a diagram illustrating an arrangement structure of a plurality of pixel blocks in a display apparatus according to an embodiment.

FIG. 14 is a diagram illustrating an arrangement structure of a plurality of pixel blocks in a display apparatus according to an embodiment.

A display panel 100 according to an embodiment may be connected with a plurality of COFs 310 with a plurality of data drive ICs 320 respectively mounted thereon. A display area of the display panel 100 may include a plurality of pixel blocks B1 to Bm which enables a viewing angle to be independently controlled. Each of the plurality of pixel blocks B1 to Bm may be independently controlled by first and second mode control line sets, and thus, may be selectively controlled to the wide viewing angle (the share mode) or the narrow viewing angle (the privacy mode).

As described above, a display panel and a display apparatus according to some embodiments may selectively drive a first light emitting device corresponding to a first lens region and a second light emitting device corresponding to a second lens region in each subpixel, and thus, may control a viewing angle of a plurality of regions to a wide viewing angle or a narrow viewing angle in a display area, thereby decreasing power consumption.

A display panel and a display apparatus according to some embodiments may control a plurality of regions to a wide viewing angle or a narrow viewing angle for each region by using first and second mode control signals, and thus, may freely adjust a ratio (an area) of a wide viewing angle region and a narrow viewing angle region in a first direction and a second direction, in addition to positions of the wide viewing angle region and the narrow viewing angle region.

Based on the demands of users or content, a display panel and a display apparatus according to some embodiments may freely adjust a ratio (an area) of a wide viewing angle region and a narrow viewing angle region in a first direction and a second direction, in addition to positions of the wide viewing angle region and the narrow viewing angle region, thereby enhancing the convenience and satisfaction of a user.

In a display panel and a display apparatus according to some embodiments, one of a first mode control line, a second mode control line, and a second power line may be alternately arranged between unit pixels, and a plurality of subpixels of a unit pixel may share a first power line, thereby decreasing a pixel pattern density.

A display panel according to some aspects may include a plurality of pixel blocks each including a plurality of unit pixels disposed in a display area, a bezel area disposed outside the display area, and a plurality of mode control line sets respectively connected with the plurality of pixel blocks, wherein each of the plurality of mode control line sets comprises a first mode control line transferring a first mode control signal and a second mode control line transferring a second mode control signal, each of the plurality of unit pixels comprises a plurality of subpixels. Each of the plurality of subpixels may include a first light emitting device connected with a driving transistor through a first mode control transistor controlled by the first mode control signal, a first lens region disposed on the first light emitting device, a second light emitting device connected with the driving transistor through a second mode control transistor controlled by the second mode control signal, and a second lens region disposed on the second light emitting device, and one of the first mode control line, the second mode control line, and a second power line is disposed in parallel with a first power line, between the unit pixels.

In the display panel according to some aspects, the first mode control line, the second mode control line, and the second power line may be alternately arranged in a first direction between different unit pixels.

In the display panel according to some aspects, the first power line may be shared by the plurality of subpixels included in a corresponding unit pixel.

According to some aspects, in each subpixel, when the first mode control signal is activated, the first light emitting device may be driven and controls a first-direction viewing angle to a wide viewing angle through the first lens region, and when the second mode control signal is activated, the second light emitting device may be driven and controls the first-direction viewing angle to a narrow viewing angle, which is narrower than the wide viewing angle through the first lens region, through the second lens region.

According to some aspects, in each of the plurality of pixel blocks, the first mode control line may comprise a first mode control line of a first type arranged in a first direction and a first mode control line of a second type arranged in a second direction, the second mode control line may comprise a second mode control line of the first type arranged in the first direction and a second mode control line of the second type arranged in the second direction, and the first mode control line of the second type and the second mode control line of the second type may be disposed between different unit pixels.

In the display panel according to some aspects, the first mode control line of the first type and the second mode control line of the first type disposed in one of the plurality of pixel blocks may be separated from a first mode control line of the second type and a second mode control line of the second type disposed in the other pixel block adjacent to the one pixel block in the first direction.

In the display panel according to some aspects, the first mode control line of the second type and the second mode control line of the second type disposed in one of the plurality of pixel blocks may extend in the second direction up to the other pixel blocks adjacent to the one pixel block in the second direction.

In the display panel according to some aspects, a data line and an initialization voltage line extending in the second direction may be disposed in each subpixel.

According to some aspects, in a first type pixel area included in each pixel block, the first mode control line of the first type may be connected with the first mode control line of the second type through a first contact hole of an insulation layer, and the second mode control line of the first type may be connected with the second mode control line of the second type through a second contact hole of the insulation layer.

According to some aspects, in a second type pixel area included in each pixel block, the first mode control line of the first type may overlap with the first mode control line of the second type with an insulation layer therebetween, and the second mode control line of the first type may overlap with the second mode control line of the second type with the insulation layer therebetween.

According to some aspects, in a third type pixel area included in each pixel block, the first mode control line of the first type may be separated from a first mode control line of the first type of an adjacent pixel block, and the second mode control line of the first type may be separated from a second mode control line of the first type of the adjacent pixel block.

In the display panel according to some aspects, each of the plurality of mode control line sets may further comprises a first mode control line of a third type and a second mode control line of the third type disposed in the bezel area, an electrostatic discharge circuit connected with each of the first mode control line of the third type and the second mode control line of the third type, and a lighting test circuit connected with each of the first mode control line of the third type and the second mode control line of the third type.

In the display panel according to some aspects, each of the plurality of mode control line sets may further comprise a first mode control line of a fourth type disposed in the first direction in the bezel area to connect the first mode control line of the third type with the first mode control line of the second type, and a second mode control line of the fourth type disposed in the first direction in the bezel area to connect the second mode control line of the third type with the second mode control line of the second type.

In the display panel according to some aspects, each subpixel may further comprise a storage capacitor connected with a gate electrode of the driving transistor, a first switching transistor transferring a data voltage of a data line to a first electrode of the storage capacitor in response to a first scan signal of a first gate line, a second switching transistor connecting the driving transistor in a diode structure in response to a second scan signal of a second gate line, a third switching transistor transferring an initialization voltage of an initialization voltage line to the first electrode of the storage capacitor in response to an emission control signal of a third gate line, a fourth switching transistor connecting the driving transistor with the first and second mode control transistors in response to the emission control signal of the third gate line, a fifth switching transistor transferring the initialization voltage of the initialization voltage line to an anode electrode of the second light emitting device in response to the second scan signal of the second gate line, and a seventh switching transistor transferring the initialization voltage of the initialization voltage line to an anode electrode of the first light emitting device in response to the second scan signal of the second gate line.

In the display panel according to some aspects, the first light emitting device may comprise a first emission region, and the first lens overlaps the first emission region and may comprise a bottom surface which is wider than the first emission region.

In the display panel according to some aspects, the second light emitting device may comprise a plurality of second emission regions, the second lens region may comprise a plurality of second lenses respectively overlapping the plurality of second emission regions, and each of the plurality of second lenses may comprise a bottom surface which is wider than each of the plurality of second emission regions.

In the display panel according to some aspects, the plurality of subpixels may comprise a first color subpixel, a second color subpixel, and a third color subpixel, sizes of the first lenses of the first color subpixel, the second color subpixel, and the third color subpixel may differ, and the number of second lenses of first color subpixels, the number of second lenses of second color subpixels, and the number of second lenses of third color subpixels may differ.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a plurality of pixel blocks each including a plurality of unit pixels disposed in a display area;
a bezel area disposed adjacent to the display area; and
a plurality of mode control line sets respectively connected with the plurality of pixel blocks,
wherein each of the plurality of mode control line sets comprises a first mode control line transferring a first mode control signal and a second mode control line transferring a second mode control signal,
wherein each of the plurality of unit pixels comprises a plurality of subpixels, each of the plurality of subpixels comprises:
a first light emitting device connected with a driving transistor through a first mode control transistor controlled by the first mode control signal;
a first lens region disposed on the first light emitting device;
a second light emitting device connected with the driving transistor through a second mode control transistor controlled by the second mode control signal; and
a second lens region disposed on the second light emitting device, and
wherein one of the first mode control line, the second mode control line, and a second power line is disposed in parallel with a first power line, for at least some portions between the plurality of unit pixels,
wherein, in each of the plurality of pixel blocks:
the first mode control line comprises a first mode control line of a first type arranged in a first direction and a first mode control line of a second type arranged in a second direction transverse to the first direction,
the second mode control line comprises a second mode control line of the first type arranged in the first direction and a second mode control line of the second type arranged in the second direction,
the first mode control line of the second type and the second mode control line of the second type are disposed between different unit pixels of the plurality of unit pixels, and
the first mode control line of the first type and the second mode control line of the first type disposed in one of the plurality of pixel blocks are separated from the first mode control line of the second type and the second mode control line of the second type disposed in the other pixel block adjacent to the one pixel block in the first direction.

2. The display panel of claim 1, wherein the first mode control line, the second mode control line, and the second power line are alternately arranged in a first direction between different unit pixels of the plurality of unit pixels.

3. The display panel of claim 1, wherein the first power line is shared by the plurality of subpixels included in a corresponding unit pixel.

4. The display panel of claim 1, wherein, in each subpixel,
when the first mode control signal is activated, the first light emitting device is driven and controls a first-direction viewing angle to a wide viewing angle through the first lens region, and
when the second mode control signal is activated, the second light emitting device is driven and controls the first-direction viewing angle to a narrow viewing angle, which is narrower than the wide viewing angle through the first lens region, through the second lens region.

5. The display panel of claim 1, wherein the first mode control line of the second type and the second mode control line of the second type disposed in one of the plurality of pixel blocks extend in the second direction up to the other pixel blocks adjacent to the one pixel block in the second direction.

6. The display panel of claim 1, wherein a data line and an initialization voltage line extending in the second direction are disposed in each subpixel.

7. The display panel of claim 1, wherein, in a first type pixel area included in each pixel block:
the first mode control line of the first type is connected with the first mode control line of the second type through a first contact hole of an insulation layer, and
the second mode control line of the first type is connected with the second mode control line of the second type through a second contact hole of the insulation layer.

8. The display panel of claim 1, wherein, in a second type pixel area included in each pixel block:
the first mode control line of the first type overlaps with the first mode control line of the second type with an insulation layer therebetween, and
the second mode control line of the first type overlaps with the second mode control line of the second type with the insulation layer therebetween.

9. The display panel of claim 1, wherein, in a third type pixel area included in each pixel block:
the first mode control line of the first type is separated from a first mode control line of the first type of an adjacent pixel block, and
the second mode control line of the first type is separated from a second mode control line of the first type of the adjacent pixel block.

10. The display panel of claim 1, wherein each of the plurality of mode control line sets further comprises:
a first mode control line of a third type and a second mode control line of the third type disposed in the bezel area;
an electrostatic discharge circuit connected with each of the first mode control line of the third type and the second mode control line of the third type; and
a lighting test circuit connected with each of the first mode control line of the third type and the second mode control line of the third type.

11. The display panel of claim 10, wherein each of the plurality of mode control line sets further comprises:
a first mode control line of a fourth type disposed in the first direction in the bezel area to connect the first mode control line of the third type with the first mode control line of the second type; and
a second mode control line of the fourth type disposed in the first direction in the bezel area to connect the second mode control line of the third type with the second mode control line of the second type.

12. The display panel of claim 1, wherein each subpixel further comprises:
- a storage capacitor connected with a gate electrode of the driving transistor;
- a first switching transistor transferring a data voltage of a data line to a first electrode of the storage capacitor in response to a first scan signal of a first gate line;
- a second switching transistor connecting the driving transistor in a diode structure in response to a second scan signal of a second gate line;
- a third switching transistor transferring an initialization voltage of an initialization voltage line to the first electrode of the storage capacitor in response to an emission control signal of a third gate line;
- a fourth switching transistor connecting the driving transistor with the first and second mode control transistors in response to the emission control signal of the third gate line;
- a fifth switching transistor transferring the initialization voltage of the initialization voltage line to an anode electrode of the second light emitting device in response to the second scan signal of the second gate line; and
- a seventh switching transistor transferring the initialization voltage of the initialization voltage line to an anode electrode of the first light emitting device in response to the second scan signal of the second gate line.

13. The display panel of claim 1, wherein the first light emitting device comprises a first emission region, and
  wherein the first lens region overlaps the first emission region and comprises a bottom surface which is wider than the first emission region.

14. The display panel of claim 1, wherein the second light emitting device comprises a plurality of second emission regions,
  wherein the second lens region comprises a plurality of second lenses respectively overlapping the plurality of second emission regions, and
  wherein each of the plurality of second lenses comprises a bottom surface which is wider than each of the plurality of second emission regions.

15. The display panel of claim 1, wherein the plurality of subpixels comprise a first color subpixel, a second color subpixel, and a third color subpixel,
  wherein sizes of the first lenses of the first color subpixel, the second color subpixel, and the third color subpixel differ from each other, and
  wherein the number of second lenses of the first color subpixel, the number of second lenses of the second color subpixel, and the number of second lenses of the third color subpixel differ from each other.

16. A display panel, comprising:
- a plurality of pixel blocks each including a plurality of unit pixels disposed in a display area;
- a plurality of bezel areas disposed adjacent to the display area; and
- a plurality of mode control line sets respectively connected with the plurality of pixel blocks, and each of the plurality of mode control line sets comprises first and second mode control lines of a first type, first and second mode control lines of a second type, first and second mode control lines of a third type, and first and second mode control lines of a fourth type,
wherein each of the plurality of mode control line sets comprises a first mode control line transferring a first mode control signal and a second mode control line transferring a second mode control signal,
wherein each of the plurality of unit pixels comprises a plurality of subpixels, and each of the plurality of subpixels comprises a first light emitting device connected to a first mode control transistor controlled by the first mode control signal, a second light emitting device connected to a second mode control transistor controlled by the second mode control signal, a first lens region disposed on the first light emitting device and a second lens region disposed on the second light emitting device,
wherein the first and mode control lines of the first type and the first and second mode control lines of the second type are disposed in the display area, and
wherein the first and second mode control lines of the third type and the first and second mode control lines of the fourth type are disposed in a data link region between a chip on film and the display area in one of the plurality of the bezel areas, and the first and second mode control lines of the fourth type are arranged apart from each other in a first direction.

17. The display panel of claim 16, wherein the first and second mode control lines of the second type arranged in a second direction in the display area are respectively connected with the first and second mode control lines of the third type, and
  wherein the first and second mode control lines of the first type arranged in the first direction in the display area are connected with the plurality of subpixels and are respectively connected with the first and second mode control lines of the second type arranged in the second direction.

18. A display apparatus, comprising:
the display panel of claim 1; and
a data driver disposed in the bezel area to drive data lines disposed in the display area, wherein the data driver individually supplies the first mode control signal and the second mode control signal to each of the plurality of mode control line sets.

19. A display apparatus having a display area and a bezel area adjacent to the display area, comprising:
- a plurality of pixel blocks, each pixel block including a plurality of subpixels disposed in the display area;
- a plurality of mode control lines including a first mode control line connected with the plurality of pixel blocks and a second mode control line connected with the plurality of pixel blocks, the first mode control line configured to transmit a first mode control signal and the second mode control line configured to transmit a second mode control signal,
wherein each subpixel of the plurality of subpixels includes:
  a first light emitting device;
  a second light emitting device different from the first light emitting device;
  a first mode control transistor having a gate electrode controlled by the first mode control signal;
  a second mode control transistor having a gate electrode controlled by the second mode control signal;
  a driving transistor connected with both the first mode control transistor and the second mode control transistor;
  a first lens on the first light emitting device; and
  a second lens on the second light emitting device,
wherein, during operation, the first light emitting device is driven when the first mode control signal is activated and the second light emitting device is driven when the second mode control signal is activated, and wherein light generated from the first light emitting device through the first lens has a different viewing angle from light generated from the second light emitting device through the second lens, wherein, in a first type pixel area included in each pixel block:

the first mode control line includes a first type extending in a first direction and a second type extending a second direction transverse to the first direction, the second mode control line includes a first type extending in the first direction and a second type extending the second direction, the subpixels configured to emit red, green, and blue light are grouped as a unit pixel, and the first mode control line of the first type is connected with the first mode control line of the second type through a first contact hole at a first location between adjacent unit pixels.

20. The display apparatus of claim 19, wherein a viewing angle of the plurality of subpixels included in the plurality of pixel blocks is independently controlled based on the first mode control line and the second mode control line.

21. The display apparatus of claim 19, wherein a viewing angle based on the first lens is wider than a viewing angle based on the second lens.

22. The display apparatus of claim 19, wherein the second mode control line of the first type is connected with the second mode control line of the second type through a second contact hole at a second location spaced apart by a distance from the first location, and wherein the distance between the first location and the second location is spaced apart at least by a unit pixel in the first direction.

23. The display apparatus of claim 19, wherein, in a second type pixel area included in each pixel block, the second type pixel area being adjacent to the first type pixel area:

the first mode control line of the first type overlaps with the first mode control line of the second type with an insulation layer therebetween such that the first mode control line of the first type and the first mode control line of the second type are electrically isolated from each other in the second type pixel area, and the second mode control line of the first type overlaps with the second mode control line of the second type with the insulation layer therebetween such that the first mode control line of the first type and the first mode control line of the second type are electrically isolated from each other in the second type pixel area.

24. The display apparatus of claim 23, wherein, in a third type pixel area included in each pixel block, the third type pixel area being adjacent to the second type pixel area and spaced apart from the first type pixel area:

the first mode control line of the first type is separated from a first mode control line of the first type of an adjacent pixel block, and the second mode control line of the first type is separated from a second mode control line of the first type of the adjacent pixel block.

25. An automobile comprising:

a body having a motor mounted therein;

at least one display panel in the body, the at least one display panel including:

a plurality of pixel blocks, each pixel block including a plurality of subpixels disposed in the display area;

a plurality of mode control lines including a first mode control line connected with the plurality of pixel blocks and a second mode control line connected with the plurality of pixel blocks, the first mode control line configured to transmit a first mode control signal and the second mode control line configured to transmit a second mode control signal, wherein each subpixel of the plurality of subpixels includes:

a first light emitting device;

a second light emitting device different from the first light emitting device;

a first mode control transistor having a gate electrode controlled by the first mode control signal;

a second mode control transistor having a gate electrode controlled by the second mode control signal;

a driving transistor connected with both the first mode control transistor and the second mode control transistor;

a first lens on the first light emitting device; and a second lens on the second light emitting device, wherein, during operation, the first light emitting device is driven when the first mode control signal is activated and the second light emitting device is driven when the second mode control signal is activated, wherein light generated from the first light emitting device through the first lens has a different viewing angle from light generated from the second light emitting device through the second lens, wherein, in each of the plurality of pixel blocks:

the first mode control line comprises a first mode control line of a first type arranged in a first direction and a first mode control line of a second type arranged in a second direction transverse to the first direction, the second mode control line comprises a second mode control line of the first type arranged in the first direction and a second mode control line of the second type arranged in the second direction, the first mode control line of the second type and the second mode control line of the second type are disposed between different unit pixels of the plurality of unit pixels, and the first mode control line of the second type and the second mode control line of the second type disposed in one of the plurality of pixel blocks extend in the second direction up to the other pixel blocks adjacent to the one pixel block in the second direction.

\* \* \* \* \*